US012749535B2

(12) United States Patent
Lee et al.

(10) Patent No.: US 12,749,535 B2
(45) Date of Patent: Sep. 29, 2026

(54) MEMORY DEVICE, MEMORY SYSTEM INCLUDING THE SAME, AND OPERATING METHOD OF THE MEMORY DEVICE

(71) Applicant: SAMSUNG ELECTRONICS CO., LTD., Suwon-si (KR)

(72) Inventors: Heechan Lee, Suwon-si (KR); Suyong Kim, Suwon-si (KR); Suchang Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 8 days.

(21) Appl. No.: 18/952,707

(22) Filed: Nov. 19, 2024

(65) Prior Publication Data

US 2025/0218516 A1 Jul. 3, 2025

(30) Foreign Application Priority Data

Dec. 29, 2023 (KR) ........................ 10-2023-0197696

(51) Int. Cl.

| | |
|---|---|
| ***G11C 11/00*** | (2006.01) |
| ***G11C 16/10*** | (2006.01) |
| ***G11C 16/30*** | (2006.01) |
| ***G11C 16/34*** | (2006.01) |
| *G11C 16/04* | (2006.01) |

(52) U.S. Cl.

CPC .............. *G11C 16/10* (2013.01); *G11C 16/30* (2013.01); *G11C 16/3459* (2013.01); *G11C 16/0483* (2013.01)

(58) Field of Classification Search

CPC ..... G11C 16/10; G11C 16/30; G11C 16/3459; G11C 16/0483

See application file for complete search history.

(56) References Cited

U.S. PATENT DOCUMENTS

| | | | | |
|---|---|---|---|---|
| 8,031,525 | B2 | 10/2011 | Park | |
| 8,934,305 | B2 * | 1/2015 | Park | G11C 11/5628 365/185.24 |
| 10,014,063 | B2 | 7/2018 | Tseng et al. | |
| 2022/0392553 | A1 | 12/2022 | Wang et al. | |
| 2023/0290412 | A1 * | 9/2023 | Choi | G11C 16/3459 |
| 2024/0212769 | A1 * | 6/2024 | Choi | G11C 16/08 |

FOREIGN PATENT DOCUMENTS

| | | |
|---|---|---|
| CN | 115376597 | 11/2022 |
| KR | 10-0861378 | 10/2008 |
| KR | 10-0890017 | 3/2009 |

* cited by examiner

*Primary Examiner* — Pho M Luu

(74) *Attorney, Agent, or Firm* — Fish & Richardson P.C.

(57) ABSTRACT

A memory device includes control logic configured to control memory cell planes based on a determination result, wherein the control logic is further configured to, in response to the determination result for a first program loop in which a first memory cell plane is determined to be program-passed and a second memory cell plane is determined to be program-failed through a first verify voltage for a first program state, control the memory cell planes so that a number of times the verify operation of the first memory cell plane is performed is different from a number of times the verify operation of the second memory cell plane is performed in a second program loop performed sequentially after the first program loop.

20 Claims, 20 Drawing Sheets

(a) Fail Plane WL Verify Level (b) Pass Plane WL Verify Level

MEMORY DEVICE, MEMORY SYSTEM INCLUDING THE SAME, AND OPERATING METHOD OF THE MEMORY DEVICE

CROSS-REFERENCE TO RELATED APPLICATION

This application claims priority under 35 U.S.C. § 119 to Korean Patent Application No. 10-2023-0197696, filed in the Korean Intellectual Property Office on Dec. 29, 2023, the disclosure of which is incorporated by reference herein in its entirety.

BACKGROUND

Semiconductor memory may be divided into volatile memory devices, which lose stored data when the power supply is cut off, such as static RAM (SRAM), dynamic RAM (DRAM), and synchronous DRAM (SDRAM), and non-volatile memory devices, which retain stored data even when the power supply is cut off, such as read only memory (ROM), programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), and ferroelectric RAM (FRAM).

Flash memory devices are widely used as mass storage media in computing systems. Recently, advances in computing technology have required flash memory-based large-capacity storage media with further improved performance. To improve the performance of such flash memory-based mass storage media, various techniques or devices have been developed.

SUMMARY

In general, in some aspects, the present disclosure is directed toward a memory device that includes a plurality of memory cell planes and performs multi-plane program operations, thereby saving power required for data write operations.

According to some aspects of the present disclosure, a memory device includes a voltage generator configured to generate voltages for a plurality of program loops for memory cells, wherein each of the plurality of program loops includes a program operation and at least one verify operation, wherein the verify operation uses one of a plurality of verify voltages for verifying a plurality of program states, a plurality of memory cell planes each including a plurality of memory cells, performing a plurality of program loops in response to the voltages, and outputting a determination result corresponding to the at least one verify operation for each program loop, and control logic configured to control the memory cell planes based on the determination result, wherein the control logic is further configured to, in response to the determination result regarding a first program loop in which a first memory cell plane is determined to be program-passed and a second memory cell plane is determined to be program-failed through a first verify voltage for a first program state, control the memory cell planes so that a number of times the verify operation of the first memory cell plane is performed is different from a number of times the verify operation of the second memory cell plane is performed in a second program loop performed sequentially after the first program loop.

According to some aspects of the present disclosure, a memory system includes a memory controller, and a memory device, wherein the memory device includes a voltage generator configured to generate voltages for a plurality of program loops for memory cells, wherein each of the plurality of program loops includes a program operation and at least one verify operation, wherein the verify operation uses one of a plurality of verify voltages for verifying a plurality of program states, a plurality of memory cell planes each including a plurality of memory cells, performing a plurality of program loops in response to the voltages, and outputting a determination result corresponding to the at least one verify operation for each program loop, and control logic configured to control the memory cell planes based on the determination result, wherein the control logic is configured to, in response to the determination result for a first program loop in which a first memory cell plane is determined to be program-passed and a second memory cell plane is determined to be program-failed through a first verify voltage for a first program state, control the memory cell planes so that a number of times the verify operation of the first memory cell plane is performed is different from a number of times the verify operation of the second memory cell plane is performed in a second program loop performed sequentially after the first program loop.

According to some aspects of the present disclosure, an operating method of a memory device, wherein the memory device includes a voltage generator configured to generate voltages for a plurality of program loops for memory cells, wherein each of the plurality of program loops includes a program operation and at least one verify operation, wherein the verify operation uses one of a plurality of verify voltages for verifying a plurality of program states, a plurality of memory cell planes each including a plurality of memory cells, performing a plurality of program loops in response to the voltages, and outputting a determination result corresponding to the at least one verify operation for each program loop, and control logic configured to control the memory cell planes based on the determination result, wherein the operating method includes receiving a determination result for a first program loop in which a first memory cell plane is determined to be program-passed and a second memory cell plane is determined to be program-failed through a first verify voltage for a first program state, and controlling the memory cell planes so that a number of times the verify operation of the first memory cell plane is performed is different from a number of times the verify operation of the second memory cell plane is performed in a second program loop performed sequentially after the first program loop.

BRIEF DESCRIPTION OF THE DRAWINGS

Example implementations will be more clearly understood from the following detailed description, taken in conjunctions with the accompanying drawings.

DETAILED DESCRIPTION

Hereinafter, example implementations will be described in detail with reference to the accompanying drawings.

Figure 1:
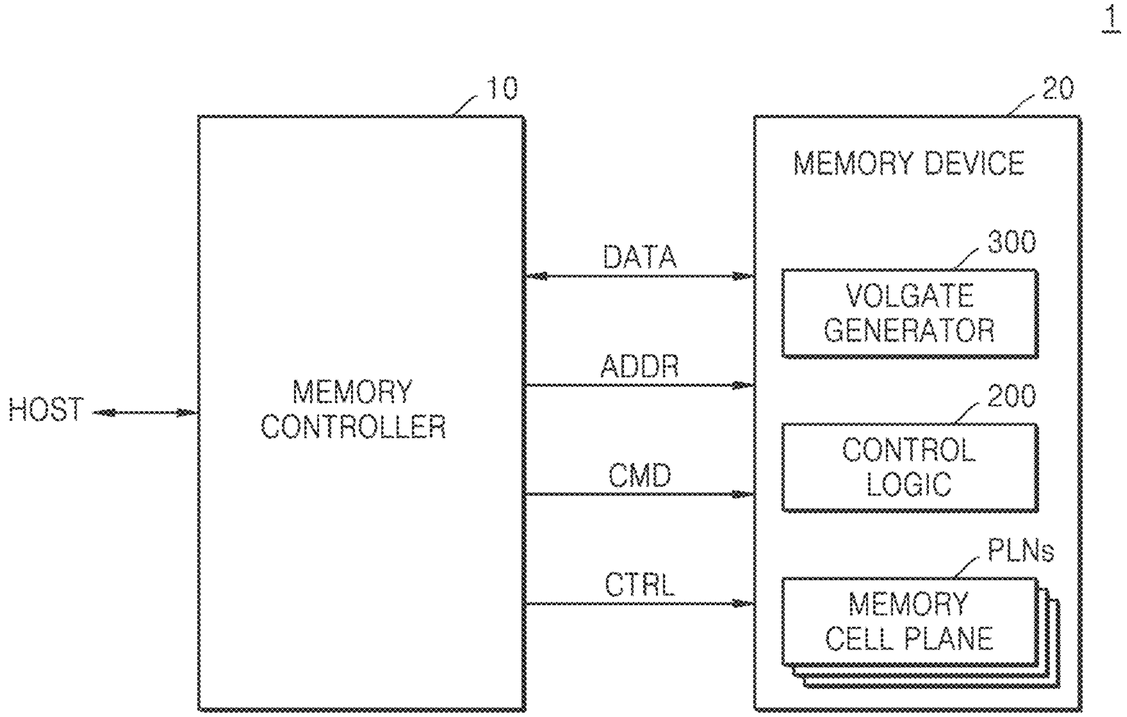
FIG. 1 is a block diagram of an example of a memory system according to some implementations.

FIG. 1 is a block diagram of an example of a memory system according to some implementations. In FIG. 1, a memory system 1 may include a memory controller 10 and a memory device 20, wherein the memory device 20 may include a plurality of memory cell planes PLNs, control logic 200, and a voltage generator 300.

According to some implementations, the memory device 20 may include a nonvolatile memory device. In some implementations, the memory system 1 may be implemented as embedded or removable memory of an electronic device. For example, the memory system 1 may be implemented in various forms, such as an embedded universal flash storage (UFS) memory device, an embedded multi-media card (eMMC), a solid state drive (SSD), a UFS memory card, compact flash (CF), secure digital (SD), micro-secure digital (Micro-SD), mini secure digital (Mini-SD), extreme digital (xD), or a memory stick.

The memory controller 10 may control the memory device 20 to read data stored in the memory device 20 or write data to the memory device 20 in response to a write/read request from a host HOST. For example, the memory controller 10 may control write, read, and erase operations for the memory device 20 by providing an address ADDR, a command CMD, and a control signal CTRL to the memory device 20. In addition, data DATA to be stored in the memory device 20 and data DATA read from the memory device 20 may be exchanged between the memory controller 10 and the memory device 20.

Each of the plurality of memory cell planes PLNs includes an independent memory cell array. Each of the memory cell planes PLNs may include a plurality of memory cells. For example, the plurality of memory cells may be flash memory cells. Hereinafter, implementations in which a plurality of memory cells are NAND flash memory cells are described in detail. However, the present disclosure is not limited thereto. In some implementations, the plurality of memory cells may be resistive memory cells, such as resistive RAM (ReRAM), phase-change RAM (PRAM), or magnetic RAM (MRAM).

In some implementations, each of the plurality of memory cell planes PLNs may include a three-dimensional memory cell array, the three-dimensional memory cell array may include a plurality of NAND strings, and each of the plurality of NAND strings may include memory cells connected to word lines, respectively, vertically stacked on a substrate. U.S. Pat. Nos. 7,679,133, 8,553,466, 8,654,587, 8,559,235, and the U.S. Patent Application Publication No. 2011/0233648 are incorporated herein by reference in their entirety and describe configurations for a three-dimensional memory array arranged in a plurality of levels with word lines and/or bit lines shared between the levels. However, the present disclosure is not limited thereto. In some implementations, each of the plurality of memory cell planes PLNs may include a two-dimensional memory cell array and the two-dimensional memory cell array may include a plurality of NAND strings arranged in row and column directions.

As a write command which requests writing is provided from the memory controller 10 to the memory device 20, a write operation may be performed based on control by the control logic 200. The write operation may be performed through a plurality of program loops and a section in which multiple program loops are performed may be referred to as a program cycle. For example, a data write operation on a memory cell may include multiple program loops within a program cycle, and a program operation using a program voltage and a verify operation using at least one verify voltage may be performed in any one program loop.

The voltage generator 300 may generate various voltages used in the memory device 20. As an example, the voltage generator 300 may generate a program voltage provided to a selected word line for the program operation and a pass voltage provided to unselected word lines. In addition, the voltage generator 300 may further generate a verify voltage and a pass voltage which are used in the verify operation to verify the program operation, and an erase voltage provided to word lines during an erase operation. In addition, the voltage generator 300 may further generate a string select voltage and a ground select voltage which are provided by string select lines and ground select lines.

The control logic 200 may control the overall operation of the memory device 20. For example, based on the command CMD, the address ADDR, and the control signal CTRL, each received from the memory controller 10, the control logic 200 may output various internal control signals for programming data to each of the plurality of memory cell planes PLNs or reading data from each of the plurality of memory cell planes PLNs. In addition, the control logic 200 may output a voltage control signal that adjusts the levels of various voltages output from the voltage generator 300 in relation to the program operation, the read operation, and the erase operation.

According to some implementations, the control logic 200 may control program loops performed to write data to each of the plurality of memory cell planes PLNs. For example, the control logic 200 may control program loops in various ways, such as controlling the number of program loops within a program cycle or adjusting various voltage levels used in the program/verify operations for each program loop.

For example, while performing the verify operation for the program loop in each of the plurality of memory cell planes PLNs, each of the plurality of memory cell planes PLNs may perform a determine operation to determine whether programming has passed or failed. According to the determination result, the control logic 200 may control the program loop so that some verify operations of some memory cell planes are skipped in the verify operation for the subsequent program loop. After the program operation is performed for one program loop, the verify operation may be performed using at least two verify voltages.

For example, in response to the determination result of a first program loop in which a first memory cell plane is determined to be program-passed and a second memory cell plane is determined to be program-failed through a first verify voltage for a first program state, the control logic 200 may control the first memory cell plane so that the first memory cell plane skips a verify operation using the first verify voltage for the first program state while the second memory cell plane performs a verify operation using the first verify voltage for the first program state in a second program loop sequentially performed after the first program loop.

For example, in response to the determination result of the first program loop, the control logic 200 may control the memory cell planes so that the first memory cell plane outputs a determination result based on a second verify voltage for a second program state and the second memory cell plane outputs a determination result based on the first verify voltage and a determination result based on the second verify voltage in the second program loop.

Accordingly, in some implementations, by skipping some verify operations of some memory cell planes within one program cycle, power required for a data write operation may be saved.

Figure 2:
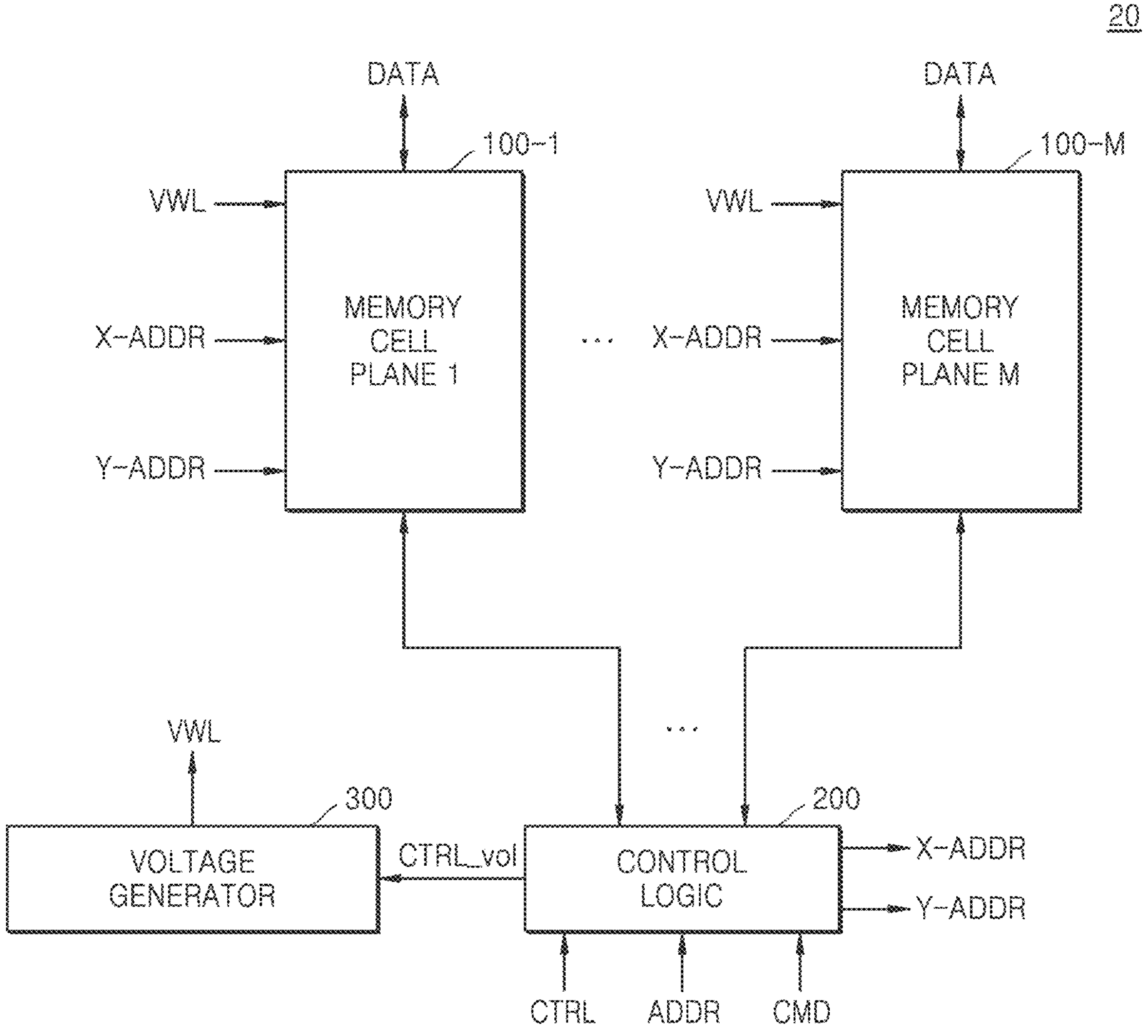
FIG. 2 is a block diagram of an example of a memory device in FIG. 1 according to some implementations.

FIG. 2 is a block diagram of an example of a memory device in FIG. 1 according to some implementations. In FIGS. 1 and 2, the memory device 20 may include first to $M^{th}$ memory cell planes 100-1 to 100-M, the control logic 200, and the voltage generator 300. The memory device 20 may further include various other components related to a memory operation, such as a data input/output circuit or an input/output interface. Here, M is an integer of 2 or more. In some implementations, the memory device 20 may perform a multi-plane program operation.

Based on the command CMD, the address ADDR, and the control signal CTRL, each received from the memory controller 10, the control logic 200 may output various internal control signals for programming data to each of the first to $M^{th}$ memory cell planes 100-1 to 100-M or reading data from each of the first to $M^{th}$ memory cell planes 100-1 to 100-M. The control logic 200 may output a voltage control signal CTRL_vol for controlling the levels of various voltages generated by the voltage generator 300.

The control logic 200 may provide a row address X-ADDR and a column address Y-ADDR to each of the first to $M^{th}$ memory cell planes 100-1 to 100-M. In a program operation, each of the first to $M^{th}$ memory cell planes 100-1 to 100-M may provide a program voltage to a word line of a select memory cell in response to the row address X-ADDR and may provide a pass voltage to word lines of unselected memory cells.

Based on the voltage control signal CTRL_vol, the voltage generator 300 may generate various types of voltages for performing program, verify, read, and erase operations for each of the first to $M^{th}$ memory cell planes 100-1 to 100-M. Specifically, the voltage generator 300 may generate a word line voltage VWL, e.g., a program voltage, a pass voltage, a verify voltage, an erase voltage, or a read voltage. In addition, the voltage generator 300 may further generate a string select line voltage and a ground select line voltage based on the voltage control signal CTRL_vol.

Figure 3:
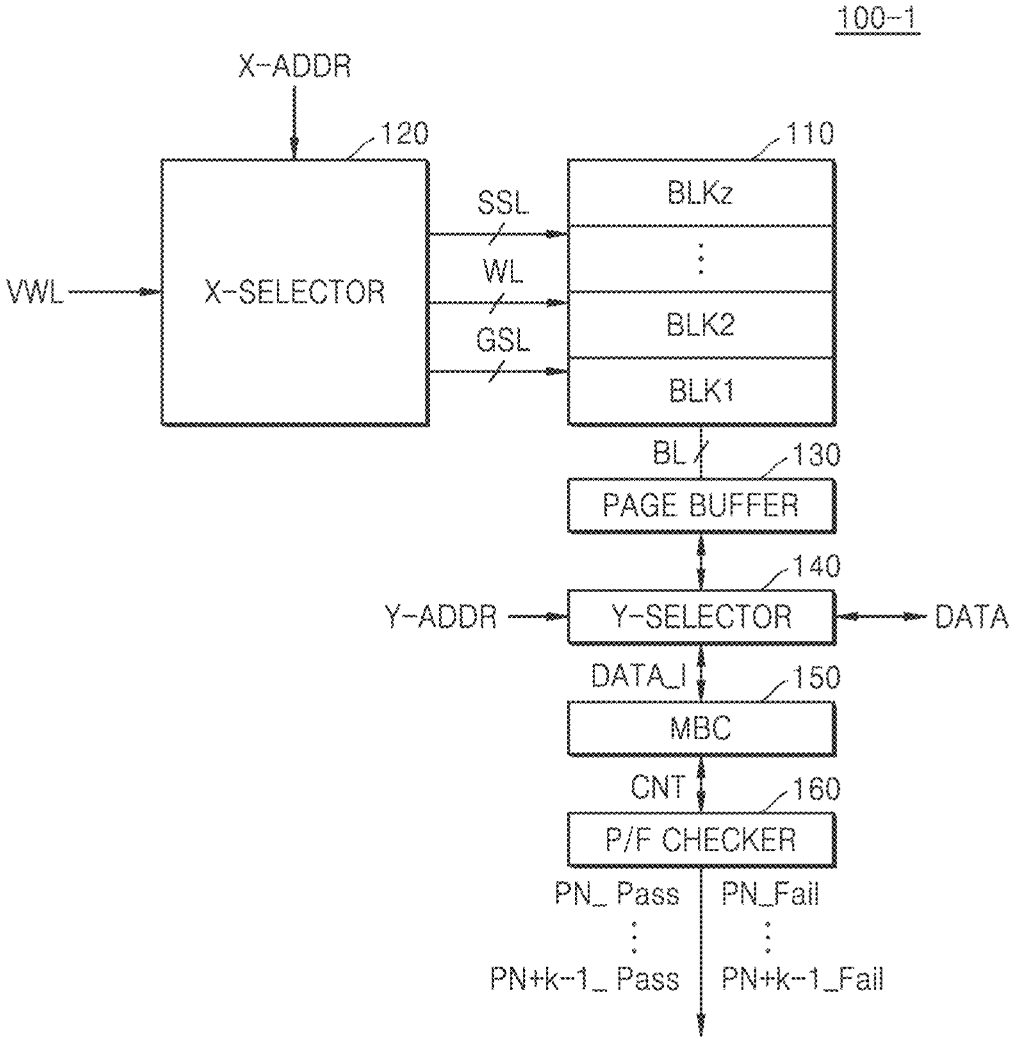
FIG. 3 is a block diagram of an example of a memory cell plane shown in FIG. 2 according to some implementations.

FIG. 3 is a block diagram of an example of a memory cell plane shown in FIG. 2 according to some implementations. Each of the first to $M^{th}$ memory cell planes 100-1 to 100-M may have the same configuration. Accordingly, only the configuration and the operation of the first memory cell plane 100-1 shown in FIG. 3 are described below.

In FIG. 3, the first memory cell plane 100-1 include a memory cell array 110, an X-selector 120, a page buffer circuit 130, a Y-selector 140, a mass bit counter (MBC) 150, and a pass/fail checker 160. The memory cell array 110 may include a plurality of memory blocks BLK1 to BLKz and may be connected to word lines WLs, string select lines SSLs, ground select lines GSLs, and bit lines BLs. The memory cell array 110 may be connected to the Y-selector 140 through the word lines WLs, the string select lines SSLs, and the ground select lines GSLs and to the page buffer circuit 130 through the bit lines BLs. Each of the memory cells may store one or more bits. As an example, each memory cell may correspond to a multi-level cell (MLC), a triple-level cell (TLC), a quad-level cell (QLC), or a penta-level cell (PLC). However, the present disclosure is not limited thereto. Each memory cell may correspond to a penta-level or higher memory cell.

In FIGS. 2 and 3, the X-selector 120 may select one of the plurality of memory blocks in response to the row address X-ADDR, one of the word lines WLs of the selected memory block, and one of the plurality of string select lines SSLs.

The page buffer circuit 130 may operate as a write driver or a sense amplifier depending on the operation mode. The page buffer circuit 130 may include a plurality of page buffers connected to the plurality of bit lines BLs, respectively. Each of the page buffers may include one or more latches that store data sensed via a corresponding bit line. Through the page buffer circuit 130, bit lines may be set up at different levels for memory cells for which programming is inhibited and memory cells for which programming will be performed.

For example, during the program operation, the page buffer circuit 130 may temporarily store external data DATA provided through the Y-selector 140 and may set bit lines of the memory cell array 110 to a specific voltage (e.g., a power supply voltage Vcc or a ground voltage GND) according to the stored data. In addition, the page buffer circuit 130 may sense data stored in memory cells of a selected word line during a read or verify operation.

The Y-selector 140 may select some bit lines from among the bit lines BL connected to the page buffer circuit 130 in response to the column address Y-ADDR. During the read operation, the data DATA sensed by the page buffer circuit 130 may be output to the outside through the Y-selector 140. During the verify operation, data DATA_I sensed by the page buffer circuit 130 may be transmitted to the MBC 150 through the corresponding Y-selector 140.

The MBC 150 may receive the data DATA_I sensed by the page buffer circuit 130 during the verify operation through the Y-selector 140 and may generate a count result CNT from the data DATA_I. For example, the MBC 150 may be an analog-to-digital converter that converts the data DATA_I at an analog level into the count result CNT that is a digital value. Specifically, the MBC 150 may receive a reference current from a current generator and may generate the count result CNT based on the received reference current. Alternatively, the MBC 150 may be implemented as a digital circuit that generates the count result CNT through a logical operation on the data DATA_I stored in the page buffer circuit 130.

The pass/fail checker 160 may receive the count result CNT from the MBC 150, generate a pass signal or a fail signal based on the count result CNT, and provide the generated pass signal or fail signal to the control logic 200. For example, when the count result CNT is less than or equal to a reference number, the pass/fail checker 160 may generate a pass signal. When the counts result CNT is greater than the reference number, the pass/fail checker 160 may generate a fail signal.

For example, the pass/fail checker 160 may determine whether the programming has passed/failed based on the count result CNT. In some implementations, whether the programming has passed/failed may be determined by determining the number of memory cells having a threshold voltage that is less than a threshold voltage. In some implementations, it may be determined that programming has passed when a certain reference value is set and the number of on cells (or the number of off cells) is less than the reference value.

Figure 4:
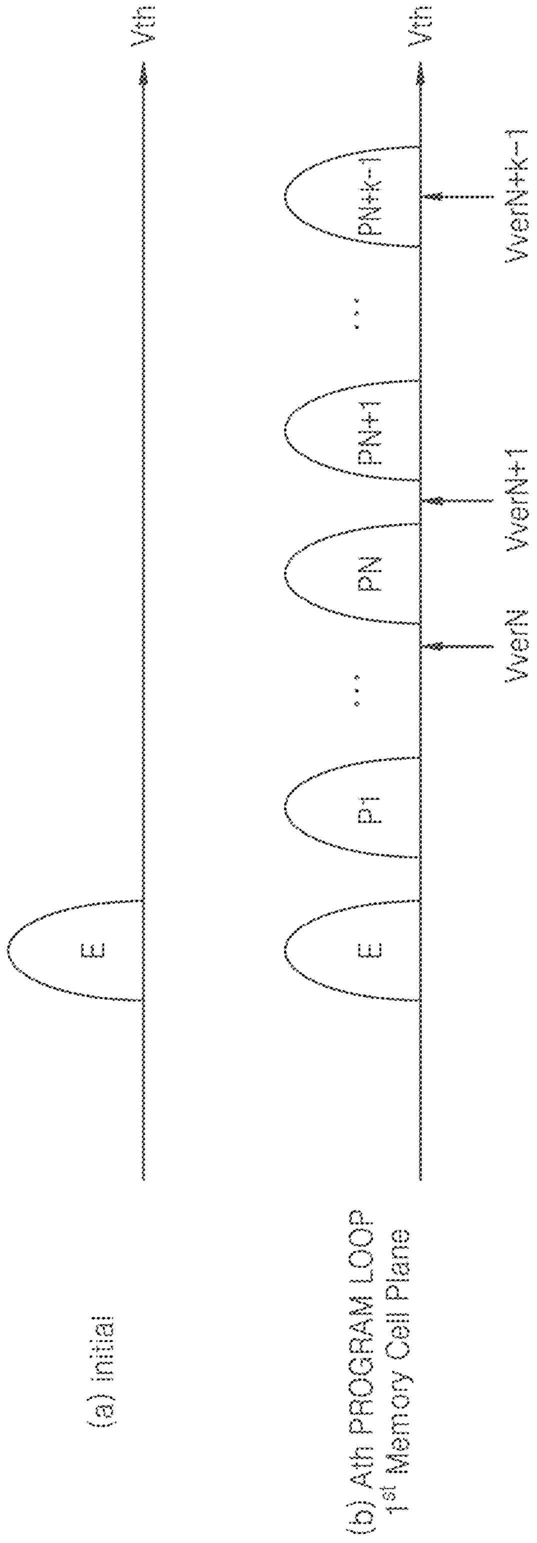
FIG. 4 is a graph illustrating an example of a change in a threshold voltage distribution of the memory cell plane shown in FIG. 3 according to execution of program loops according to some implementations.

FIG. 4 is a graph illustrating an example of a change in threshold voltage distribution of the memory cell plane shown in FIG. 3 according to execution of program loops according to some implementations. FIG. 4 shows an example of an operation in a memory device including a multi-level cell. The multi-level cell refers to a memory cell that stores a plurality of bits in one memory cell. FIG. 4 may be described with reference to FIGS. 1 to 3.

The memory cells may be programmed to any one of a plurality of states corresponding to a plurality of threshold voltage distributions depending on data values thereof. As an example, the threshold voltage distributions may have four or more states.

Referring to (a) of FIG. 4, the initial state of the memory cell may be an erase state E. In one program loop, the first memory cell plane 100-1 may program memory cells by applying a program voltage to the selected word line WL in response to a control signal from the control logic 200. In addition, in one program loop, the first memory cell plane 100-1 may verify that the program state is in a normal state by applying a verify voltage to the selected word line WL in response to the control signal from the control logic 200.

By performing the program loop, the threshold voltage of the memory cells may be changed from the erase state E to a plurality of program states. In each program loop, program operations for programming memory cells into the plurality of states may each be performed. In addition, in each program loop, a verify operation may be performed in relation to each state to verify a program operation for each of the plurality of states.

Referring to (b) of FIG. 4, the erase state E and the first to N+k−1$^{th}$ program states P1 to PN+k−1 may be classified according to the threshold voltage and the N$^{th}$ to N+k−1$^{th}$ program states PN to PN+k−1 may be verified based on the N$^{th}$ to N+k−1$^{th}$ verify voltages Vver_PN to Vver_PN+k−1 in an A$^{th}$ program loop. Herein, A, N, and k are integers of 1 or more.

For example, in any one program loop, the first memory cell plane 100-1 may perform a program operation and at least one verify operation, wherein one verify operation may use one of a plurality of verify voltages for verifying a plurality of program states.

In FIGS. 3 and 4, in the A$^{th}$ program loop, the pass/fail checker 160 may receive a count result CNT corresponding to each of the N$^{th}$ to N+k−1$^{th}$ verify voltages Vver_PN to Vver_PN+k−1 and may generate at least one pass signal PN_Pass to PN+k−1_pass or at least one fail signal PN_Fail to PN+k−1_Fail corresponding to the N$^{th}$ to N+k−1$^{th}$ verify voltages Vver_PN to Vver_PN+k−1 based on the count result CNT.

For example, in any one program loop, the pass/fail checker 160 may receive the count result CNT corresponding to each of at least one or more verify voltages and may generate at least one pass signal or at least one fail signal corresponding to each of the at least one or more verify voltages based on the count result CNT.

According to some implementations, after the pass/fail checker 160 determines that programming has passed for a specific verify voltage in one program loop, the verify operation based on the specific verify voltage may be skipped in the corresponding memory cell plane in the subsequent program loop. Accordingly, power required for a data write operation may be saved, as described in detail below.

Figure 5A:
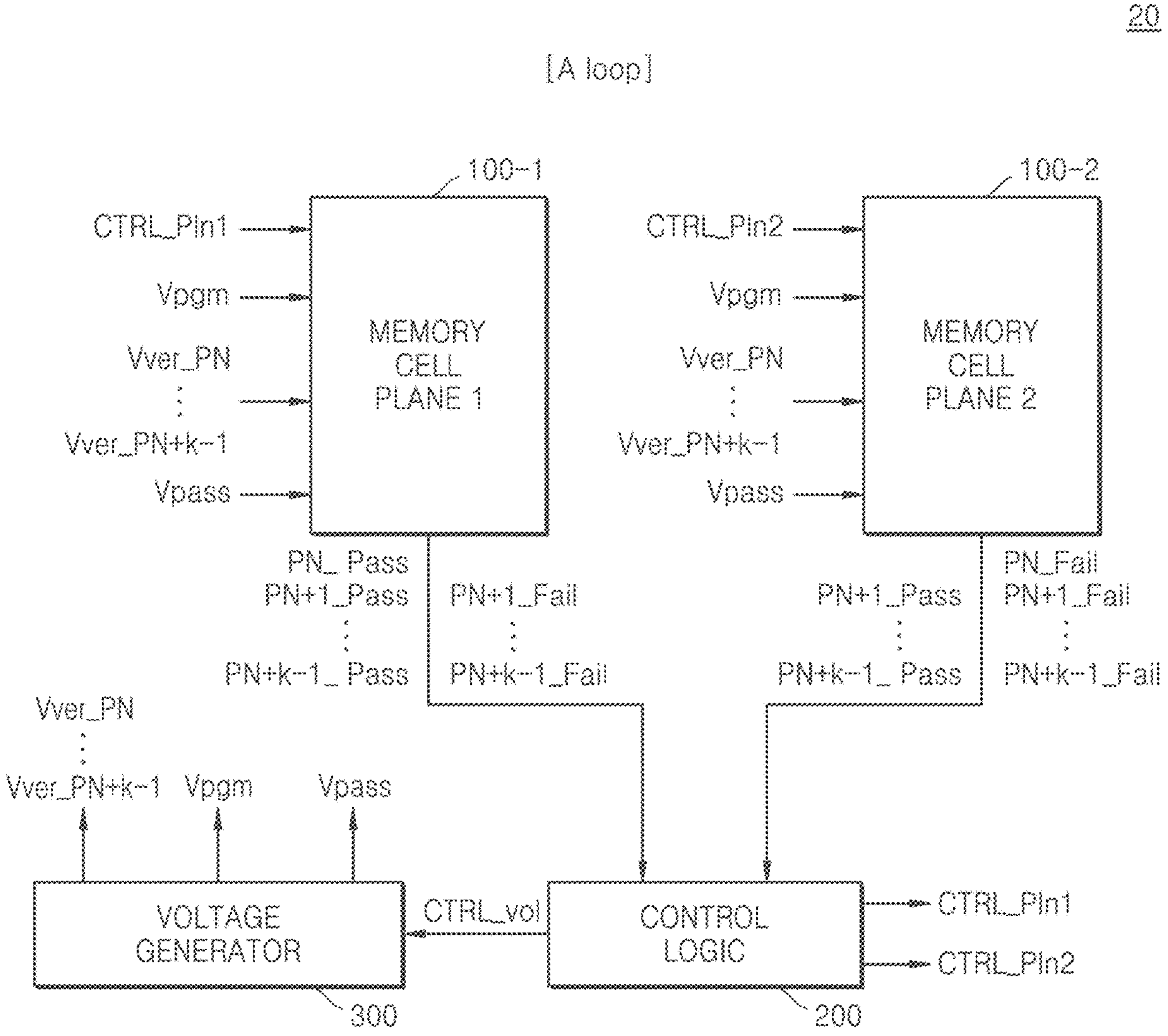
FIGS. 5A to 5C are diagrams illustrating an example of an operation of a memory device according to some implementations.
Figure 5B:
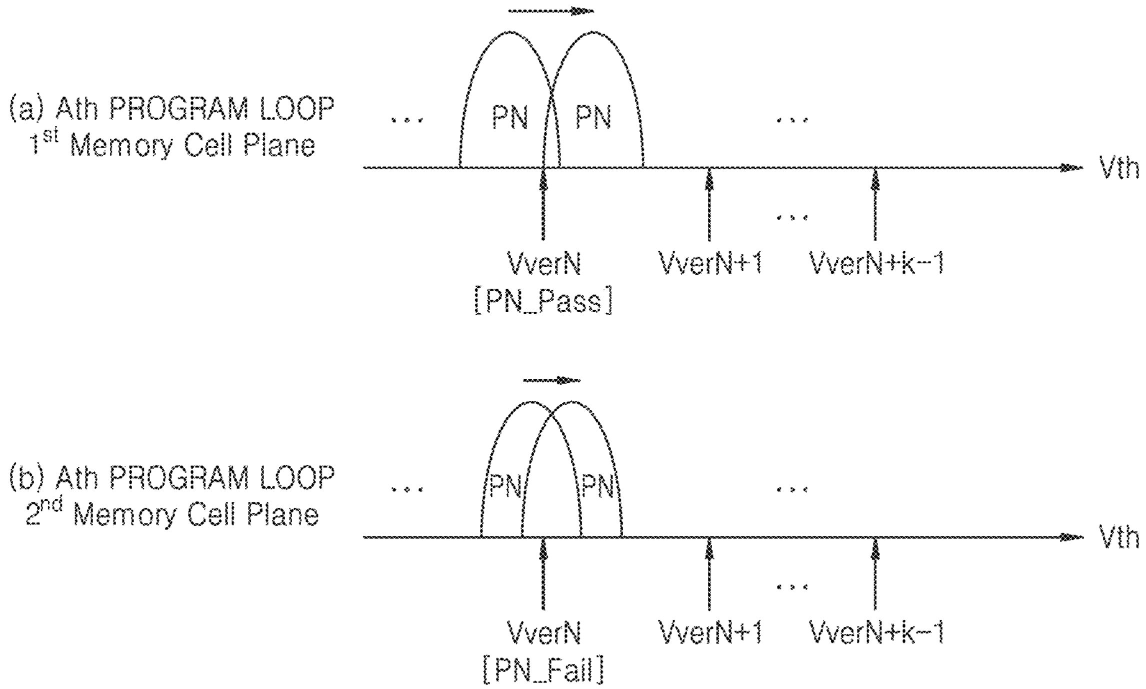
Figure 5C:
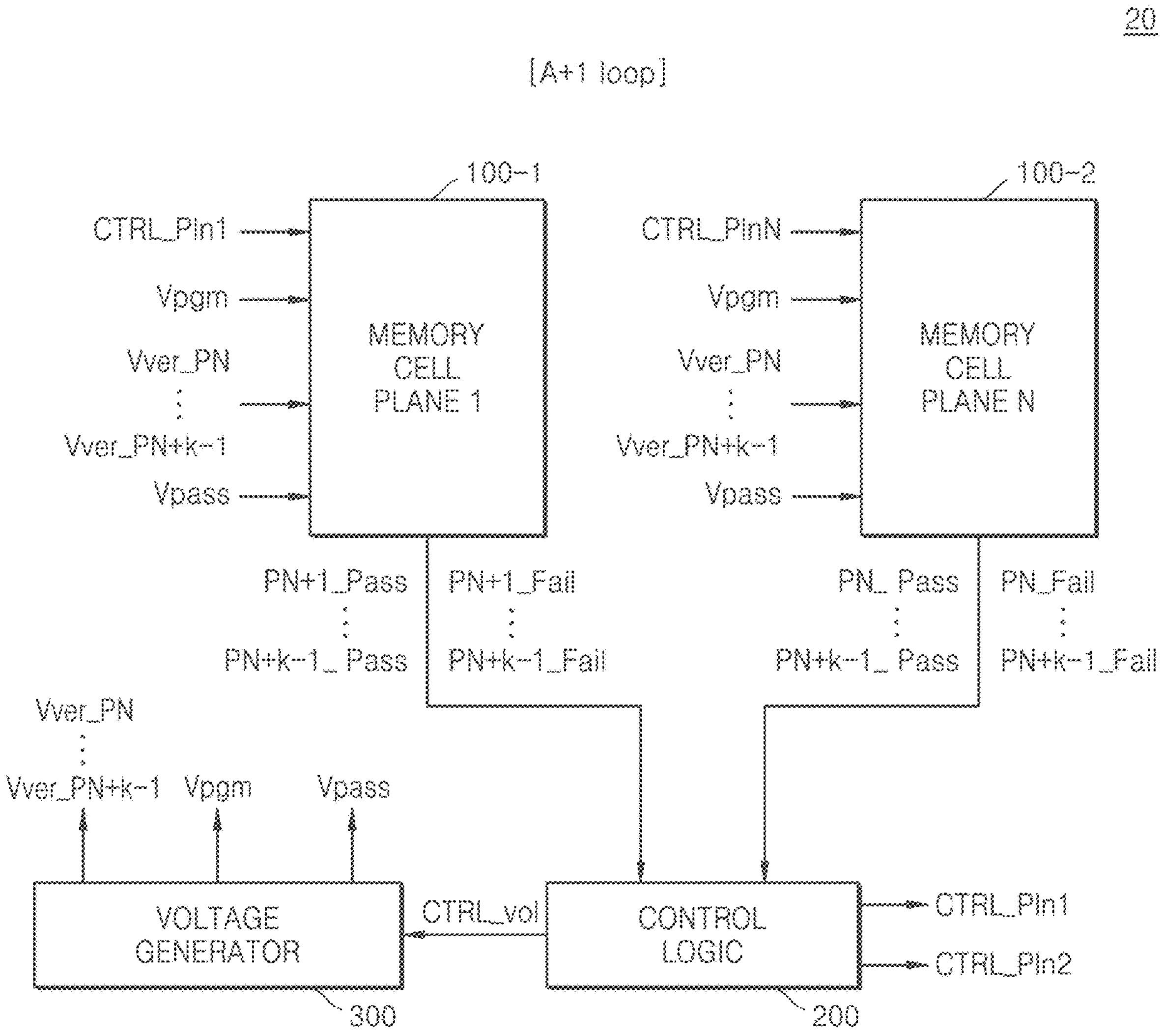

FIGS. 5A to 5C are diagrams illustrating an example of an operation of a memory device according to some implementations. FIGS. 5A to 5C may be described with reference to FIGS. 1 to 4. For convenience of explanation, FIGS. 5A to 5C illustrate the first memory cell plane 100-1 and the second memory cell plane 100-2, but are not limited thereto. The present disclosure may be applied to the first to M$^{th}$ memory cell planes 100-1 to 100-M, according to some implementations.

FIG. 5A is a diagram of the memory device 20 according to the execution of the A$^{th}$ program loop. FIG. 5B is a diagram illustrating a change in the threshold voltage distributions of the first memory cell plane 100-1 and the second memory cell plane 100-2 according to execution of the A$^{th}$ program loop. FIG. 5C is a diagram of the memory device 20 according to the execution of the A+1$^{th}$ program loop.

In FIG. 5A, the voltage generator 300 may generate voltages used in a plurality of program loops for memory cells. Each of the plurality of program loops may include a program operation and at least one verify operation, wherein the at least one verify operation may utilize one of a plurality of verify voltages for verifying a plurality of program states.

In some implementations, the voltage generator 300 may generate voltages Vpgm, Vpass, and Vver_PN to Vver_PN+k−1 used in the A$^{th}$ program loop. For example, the voltage generator 300 may generate a program voltage Vpgm and a pass voltage Vpass for a program operation and may generate at least one verify voltage for a verify operation. The at least one verify voltage may include the N$^{th}$ to N+k−1$^{th}$ verify voltages Vver_PN to Vver_PN+k−1.

The first memory cell plane 100-1 may perform a program operation based on the program voltage Vpgm and the pass voltage Vpass in response to a control signal CTRL_PLn1 of the control logic 200. In addition, the first memory cell plane 100-1 may perform at least one verify operation based on at least one verify voltage in response to the control signal CTRL_PLn1 of the control logic 200 and the second memory cell plane 100-2 may also perform a program operation and a verify operation like the first memory cell plane 100-1.

In some implementations, each of the first memory cell plane 100-1 and the second memory cell plane 100-2 may perform a plurality of program loops in response to the voltages and may output a determination result PN_Pass to PN_k−1_pass or PN_Fail to PN_k−1_Fail corresponding to at least one verify operation for each program loop.

The control logic 200 may control the memory cell planes based on the determination result.

For example, in response to the determination result of the first program loop in which the first memory cell plane 100-1 is determined to be program-passed and the second memory cell plane 100-2 is determined to be program-failed through the first verify voltage for the first program state, the control logic 200 may control the memory cell planes so that the number of times the verify operation of the first memory cell plane 100-1 is performed is different from the number of times the verify operation of the second memory cell plane 100-2 is performed in the second program loop which is performed sequentially after the first program loop.

I FIG. 5A, as a result of the $A^{th}$ program loop of the first memory cell plane 100-1 and the second memory cell plane 100-2, the $N^{th}$ program state of the first memory cell plane 100-1 is determined to be program-passed based on the $N^{th}$ verify voltage Vver_PN and the $N^{th}$ program state of the second memory cell plane 100-2 is determined to be program-failed based on the $N^{th}$ verify voltage Vver_PN.

For example, the first memory cell plane 100-1 may output the pass signal PN_Pass for the $N^{th}$ program state to the control logic 200 and the second memory cell plane 100-2 may output the fail signal PN_Fail for the $N^{th}$ program state to the controller logic 200. In addition, the first memory cell plane 100-1 and the second memory cell plane 100-2 may output pass signals PN+1_Pass to PN+k−1_pass or fail signals PN+1_Fail to PN+k−1_Fail for the $N+1^{th}$ to $N+k-1^{th}$ program states to the control logic 200.

In some implementations, in the same program loop, the pass/fail for a particular program state may be different for each memory cell plane.

In some implementations, the degree to which the threshold voltage distribution for a specific program state shifts to the right due to a program operation may be different for each memory cell plane.

In FIG. 5B, the degree to which the distribution of memory cells targeting the $N^{th}$ program state of the first memory cell plane 100-1 shifts to the right is greater than the degree to which the distribution of memory cells targeting the $N^{th}$ program state of the second memory cell plane 100-2 shifts to the right.

When the number of on cells according to the $N^{th}$ verify voltage Vver_PN is less than the reference value, it may be determined that programming has passed for the $N^{th}$ program state. When the number of on cells according to the $N^{th}$ verify voltage Vver_PN is greater than the reference value, it may be determined that programming has failed for the $N^{th}$ program state.

Since the number of on cells of the first memory cell plane 100-1 according to the $N^{th}$ verify voltage Vver_PN may be less than the reference value and the number of on cells of the second memory cell plane 100-2 according to the $N^{th}$ verify voltage Vver_PN may be greater than the reference value, the first memory cell plane 100-1 may be determined to be program-passed for the $N^{th}$ program state and the second memory cell plane 100-2 may be determined to be program-failed for the $N^{th}$ program state.

In FIG. 5C, in the $A+1^{th}$ program loop, the first memory cell plane 100-1 performs k−1 verify operations in response to the control signal CTRL_Pln1 of the control logic 200 and the second memory cell plane 100-2 performs k verify operations in response to a control signal CTRL_Pln2 of the control logic 200. For example, the control logic 200 may control the memory cell planes such that the number of times the verify operation of the first memory cell plane 100-1 is performed is different from the number of times the verify operation of the second memory cell plane 100-2 is performed in the $A+1^{th}$ program loop.

The voltage generator 300 may be configured to provide k $N^{th}$ to $N+k-1^{th}$ verify voltages Vver_PN to Vver_PN+k−1 to the first memory cell plane 100-1 and the second memory cell plane 100-2. That is, the voltage generator 300 may provide the $N^{th}$ verify voltage Vver_PN for verifying the $N^{th}$ program state to all memory cell planes until all the memory cell planes are determined to be program-passed for the $N^{th}$ program state.

By controlling the verify operation of the first memory cell plane 100-1 through the control signal CTRL_Pln1, the control logic 200 may control the first memory cell plane 100-1 and the second memory cell plane 100-2 such that the first memory cell plane 100-1 performs k−1 verify operations while the second memory cell plane 100-2 performs k verify operations in the $A+1^{th}$ program loop.

In some implementations, the control logic 200 may control the first memory cell plane 100-1 and the second memory cell plane 100-2 so that the program-passed first memory cell plane 100-1 for the $N^{th}$ program state skips the verify operation according to the $N^{th}$ verify voltage Vver_PN while the program-failed second memory cell plane 100-2 for the $N^{th}$ program state performs a verify operation according to the $N^{th}$ verify voltage Vver_PN in the $A+1^{th}$ program loop.

Although the first memory cell plane 100-1 receives the $N^{th}$ verify voltage Vver_PN from the voltage generator 300 in the $A+1^{th}$ program loop, the first memory cell plane 100-1 may not perform a verify operation based on the $N^{th}$ verify voltage Vver_PN in response to the control signal CTRL_Pln1 of the control logic 200. This is described in detail with reference to FIGS. 7 to 10.

In addition, as a result of the $A+1^{th}$ program loop, when the second memory cell plane 100-2 is still program-failed for the $N^{th}$ program state, the first memory cell plane 100-1 that is program-passed for the $N^{th}$ program state may skip a verify operation using the $N^{th}$ verify voltage Vver_PN in the $A+2^{th}$ program loop.

For example, until the second memory cell plane 100-2 is program-passed for the $N^{th}$ program state, the program-passed first memory cell plane 100-1 for the $N^{th}$ program state may skip the verify operation using the $N^{th}$ verify voltage Vver_PN in the $A+t^{th}$ program loop. Herein, t may be a positive integer greater than 1.

In FIG. 5C, in the $A+1^{th}$ program loop, the first memory cell plane 100-1 may perform k−1 verify operations to output pass signals PN+1_Pass to PN+k−1_Pass or fail signals PN+1_Fail to PN+k−1_Fail, which are determination results for the $N+1^{th}$ to $N+k-1^{th}$ program states to the control logic 200. In the $A+1^{th}$ program loop, the second memory cell plane 100-2 may perform k verify operations to output pass signals PN_Pass to PN+k−1_Pass or fail signals PN_Fail to PN+k−1_Fail, which are determination results for the $N^{th}$ to $N+k-1^{th}$ program states to the control logic 200.

In some implementations, in response to the determination result of the first program loop in which the first memory cell plane 100-1 is determined to be program-passed and the second memory cell plane 100-2 is determined to be program-failed through the first verify voltage for the first program state, the control logic 200 may control the memory cell planes such that the first memory cell plane 100-1 outputs a determination result based on the second verify voltage for the second program state and the second memory cell plane 100-2 outputs a determination result based on the first verify voltage and a determination result based on the second verify voltage in the second program loop which is performed sequentially after the first program loop. That is, the verify operation based on the first verify voltage of the first memory cell plane 100-1 in the second program loop may be skipped.

Figure 6A:
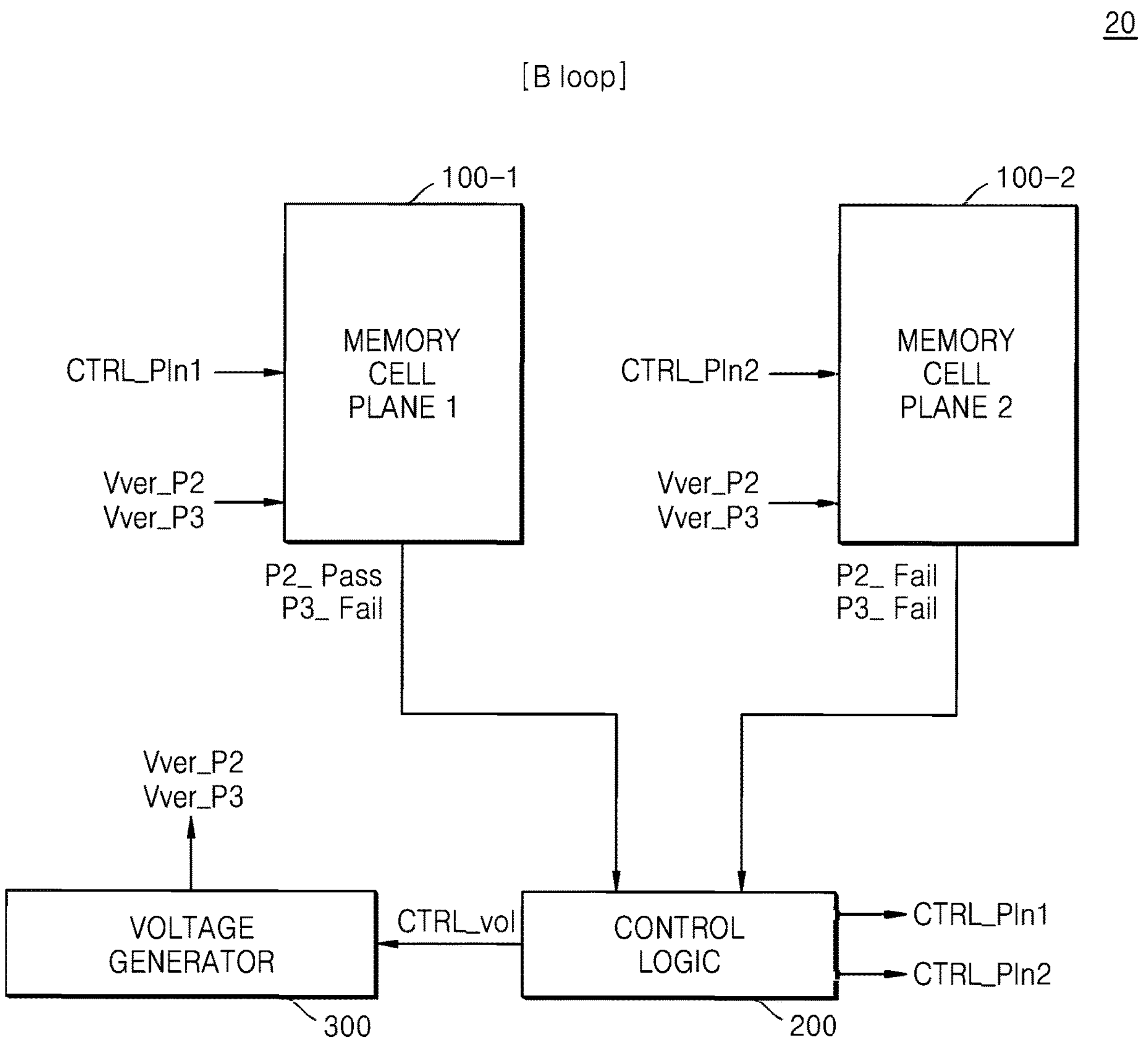
FIGS. 6A and 6B are diagrams illustrating an example of an operation of a memory device according to some implementations.
Figure 6B:
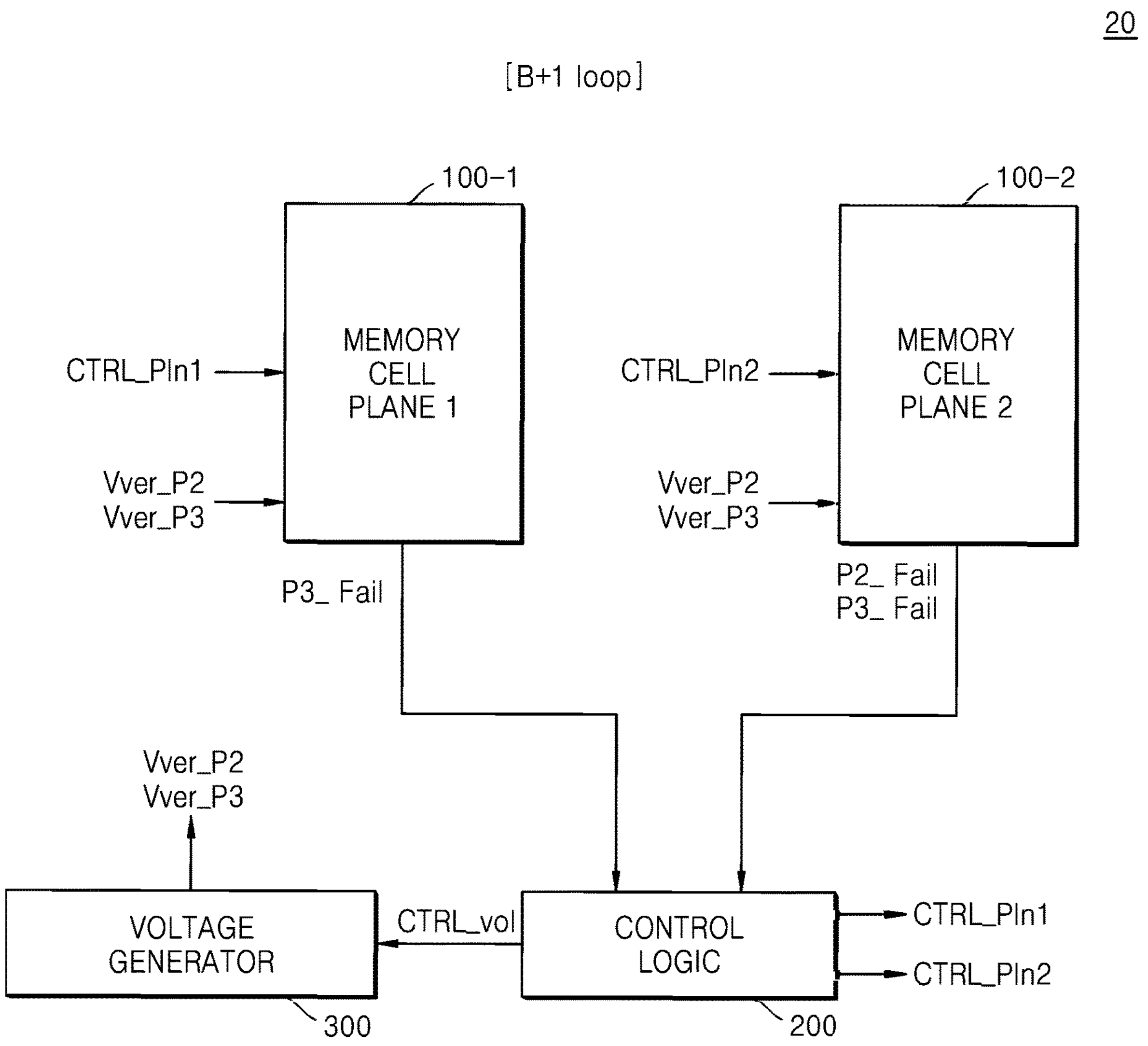

FIGS. 6A and 6B are diagrams illustrating an example of an operation of a memory device according to some implementations. FIGS. 6A and 6B may be described with reference to FIGS. 1 to 5C. For convenience of explanation, an example in which k=1 and N=2 is illustrated, but the present disclosure is not limited thereto.

FIG. 6A is a diagram of the memory device 20 according to the execution of the $B^{th}$ program loop, and FIG. 6B is a diagram of the memory device 20 according to the execution of the $B+1^{th}$ program loop. Herein, B is an integer of 1 or more.

In FIG. 6A, according to the execution of the $B^{th}$ program loop, the first memory cell plane 100-1 may output a program pass signal P2_Pass for the second program state and a program fail signal P3_Fail for the third program state to the control logic 200. In addition, according to the execution of the $B^{th}$ program loop, the second memory cell plane 100-2 may output a program fail signal P2_Fail for the second program state and a program fail signal P3_Fail for the third program state to the control logic 200.

In response to the control signal CTRL_Pln1 of the control logic 200, the first memory cell plane 100-1 may output the program pass signal P2_Pass for the second program state and the program fail signal P3_Fail for the third program state based on the second and third verify voltages Vver_P2 and Vver_P3 provided by the voltage generator 300. In response to the control signal CTRL_Pln2 of the control logic 200, the second memory cell plane 100-2 may output the program fail signals P2_Fail and P3_Fail for the second and third program states based on the second and third verify voltages Vver_P2 and Vver_P3 provided by the voltage generator 300.

In FIG. 6B, the first memory cell plane 100-1 may output the program fail signal P3_Fail for the third program state to the control logic 200 according to the execution of the $B+1^{th}$ program loop. Additionally, according to the execution of the $B+1^{th}$ program loop, the second memory cell plane 100-2 may output the program fail signal P2_Fail for the second program state and the program fail signal P3_Fail for the third program state to the control logic 200.

In response to the control signal CTRL_Pln2 of the control logic 200, the second memory cell plane 100-2 may output the program fail signals P2_Fail and P3_Fail for the second and third program states based on the second and third verify voltages Vver_P2 and Vver_P3 provided by the voltage generator 300. In response to the control signal CTRL_Pln1 of the control logic 200, the first memory cell plane 100-1 may output the program fail signal P3_Fail for the third program state based on the second and third verify voltages Vver_P2 and Vver_P3 provided by the voltage generator 300.

In some implementations, although the first memory cell plane 100-1 receives the second verify voltage Vver_P2 from the voltage generator 300 in the $B+1^{th}$ program loop, the first memory cell plane 100-1 may not perform a verify operation based on the second verify voltage Vver_P2, in response to the control signal CTRL_Pln1 of the control logic 200. Accordingly, power required for a data write operation may be saved.

Figure 7:
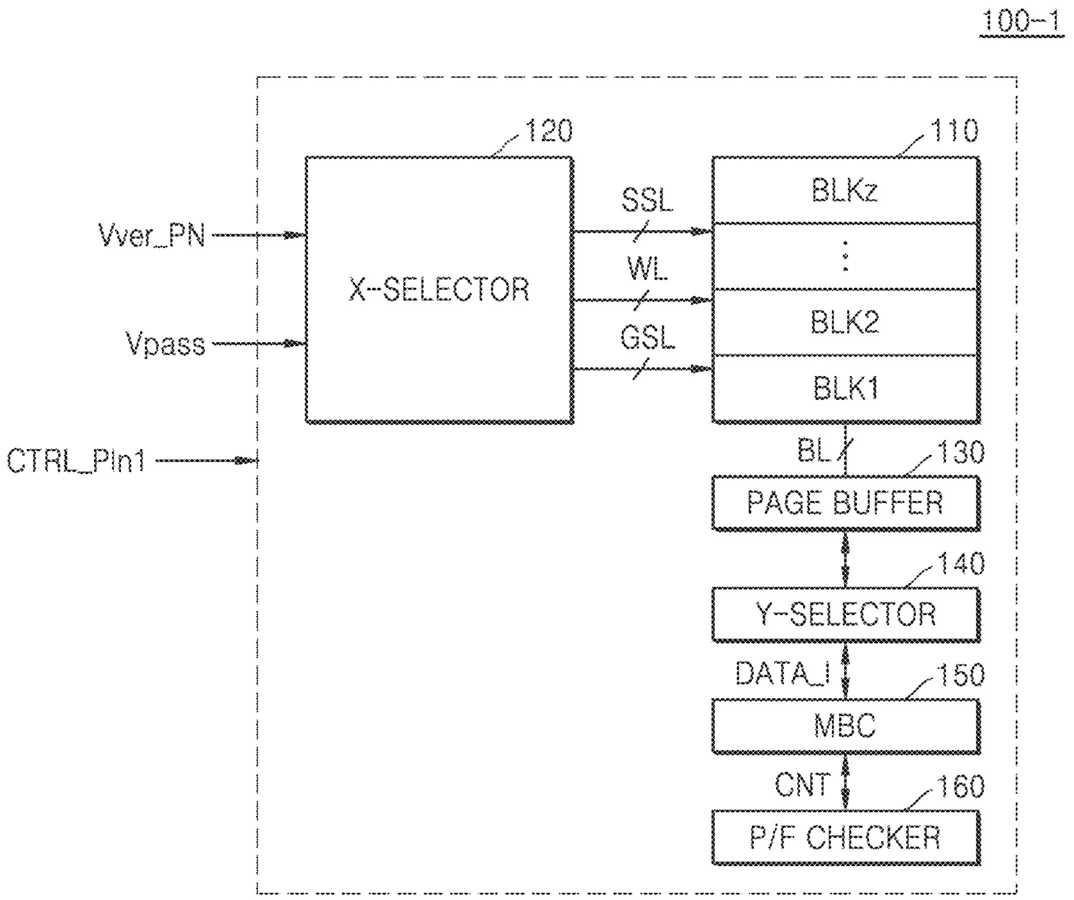
FIG. 7 is a diagram illustrating an example of an operation of a memory cell plane according to some implementations.

FIG. 7 is a diagram illustrating an example of an operation of a memory cell plane according to some implementations. FIG. 7 may be described with reference to FIGS. 1 to 5C.

In FIG. 7, although the first memory cell plane 100-1 receives the $N^{th}$ verify voltage Vver_PN from the voltage generator 300 in the $A+1^{th}$ program loop, the first memory cell plane 100-1 may not perform a verify operation based on the $N^{th}$ verify voltage Vver_PN in response to the control signal CTRL_Pln1 of the control logic 200.

Figure 9A:
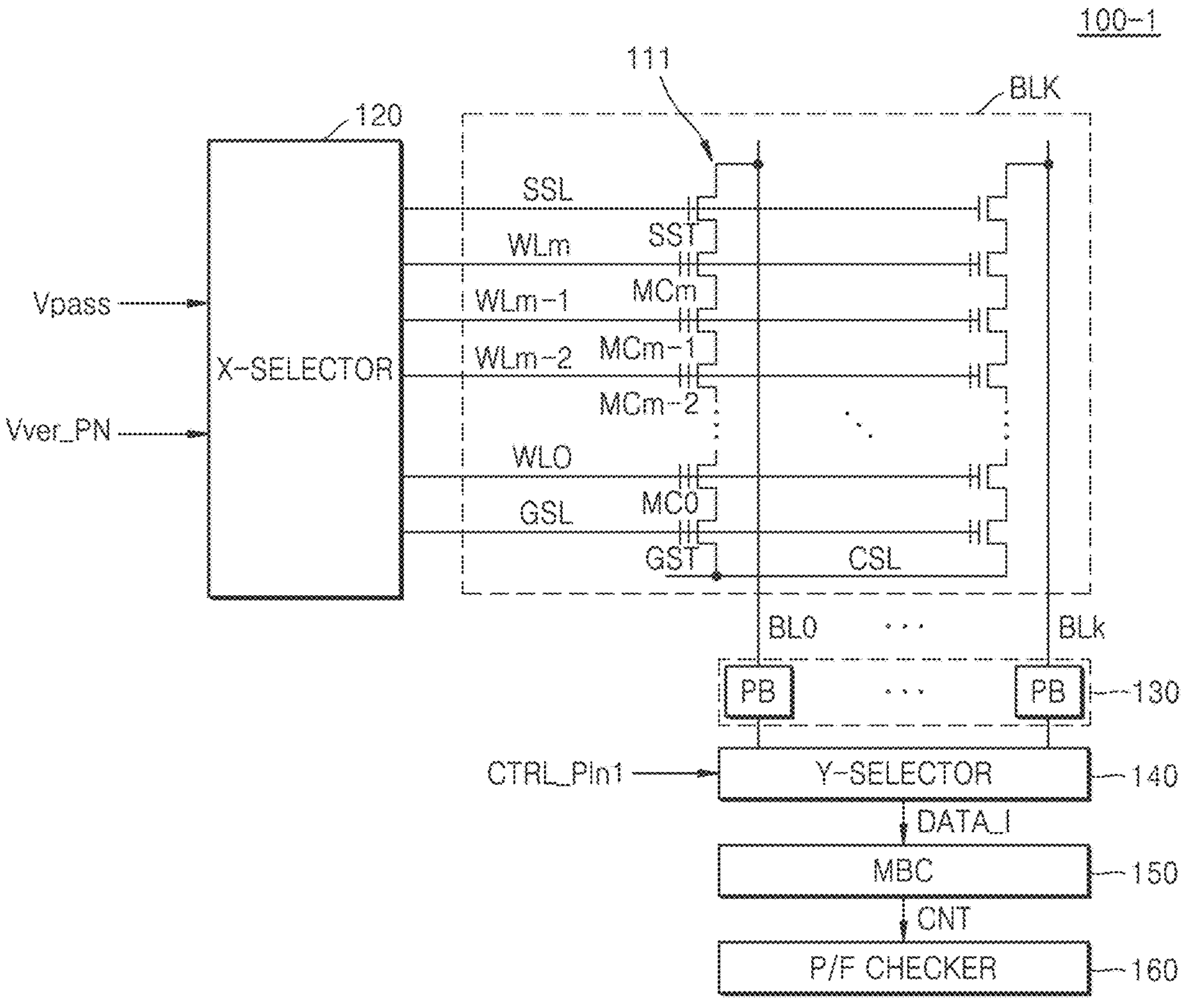
FIG. 9A is a diagram illustrating an example of an operation of a memory cell plane according to some implementations.
Figure 9B:
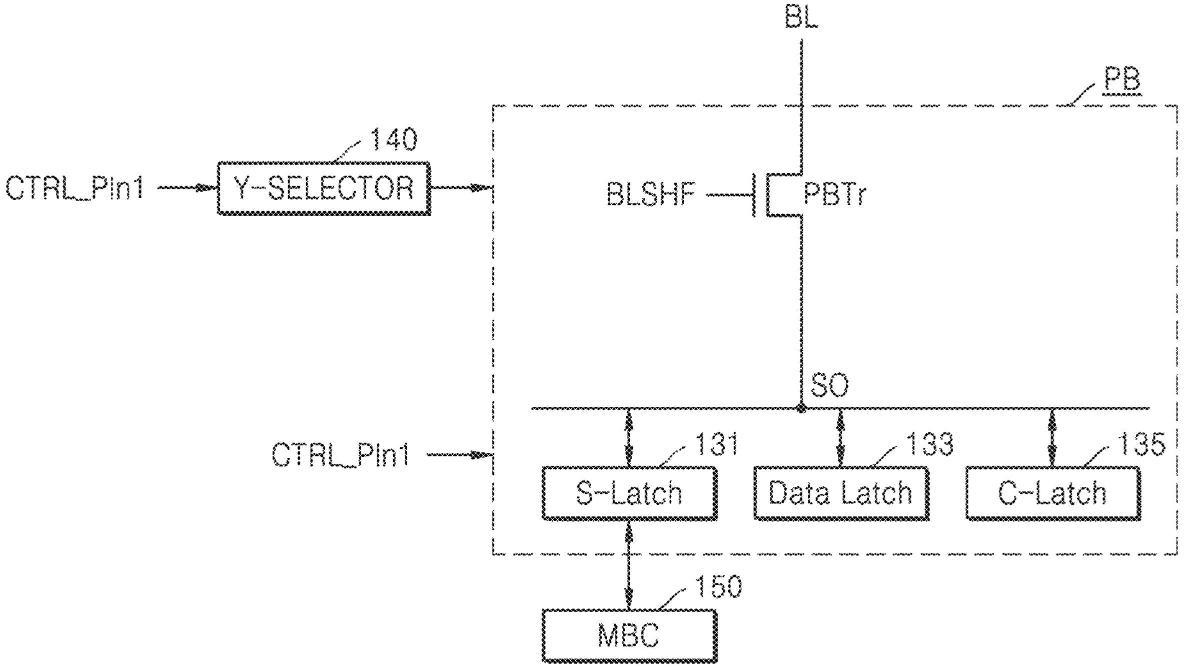
FIG. 9B is a block diagram of an example of a structure of a page buffer according to some implementations.
Figure 9C:
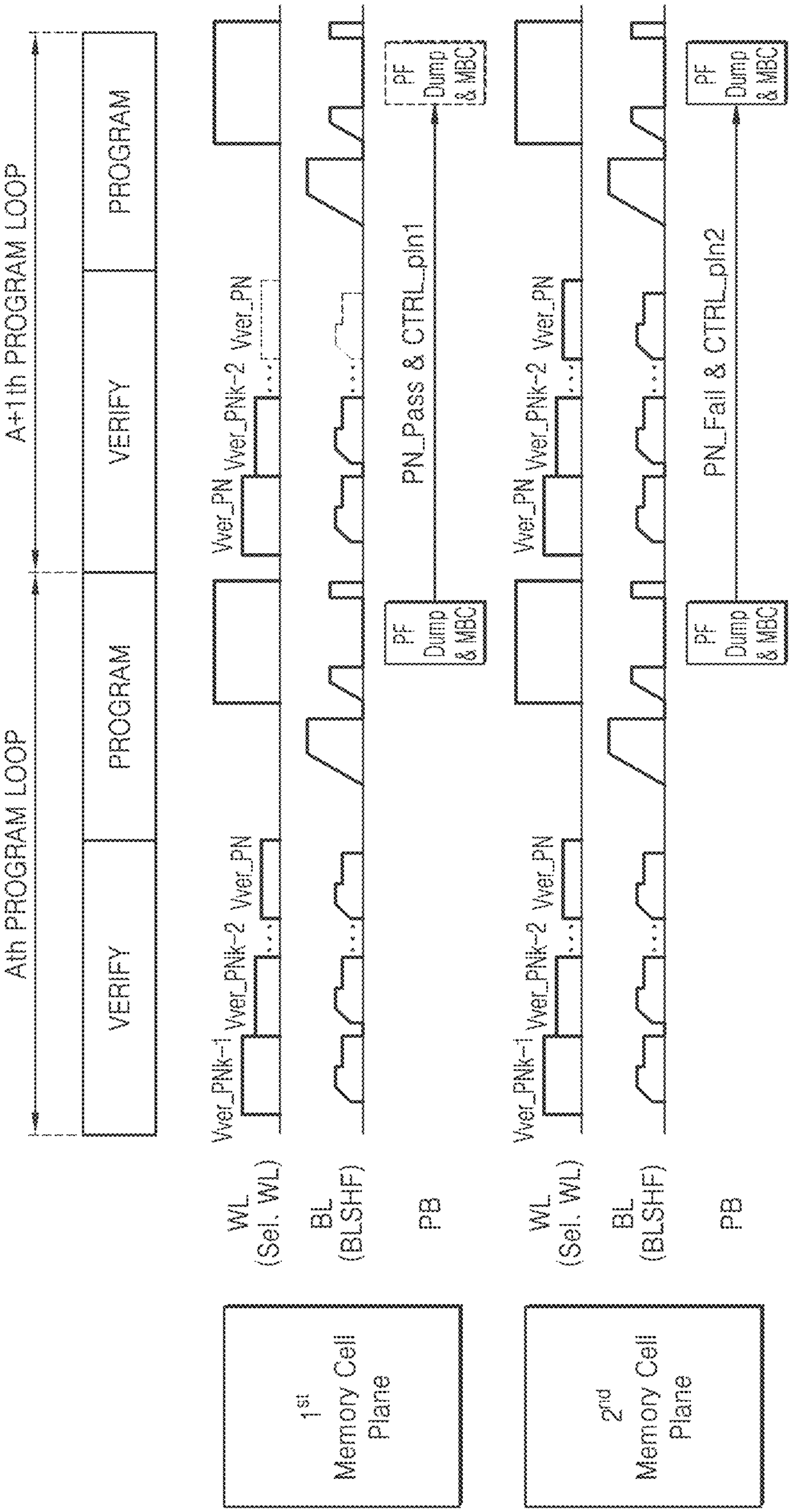
FIG. 9C is a timing diagram illustrating an example of an operation of first and second memory cell planes according to some implementations.
Figure 9D:
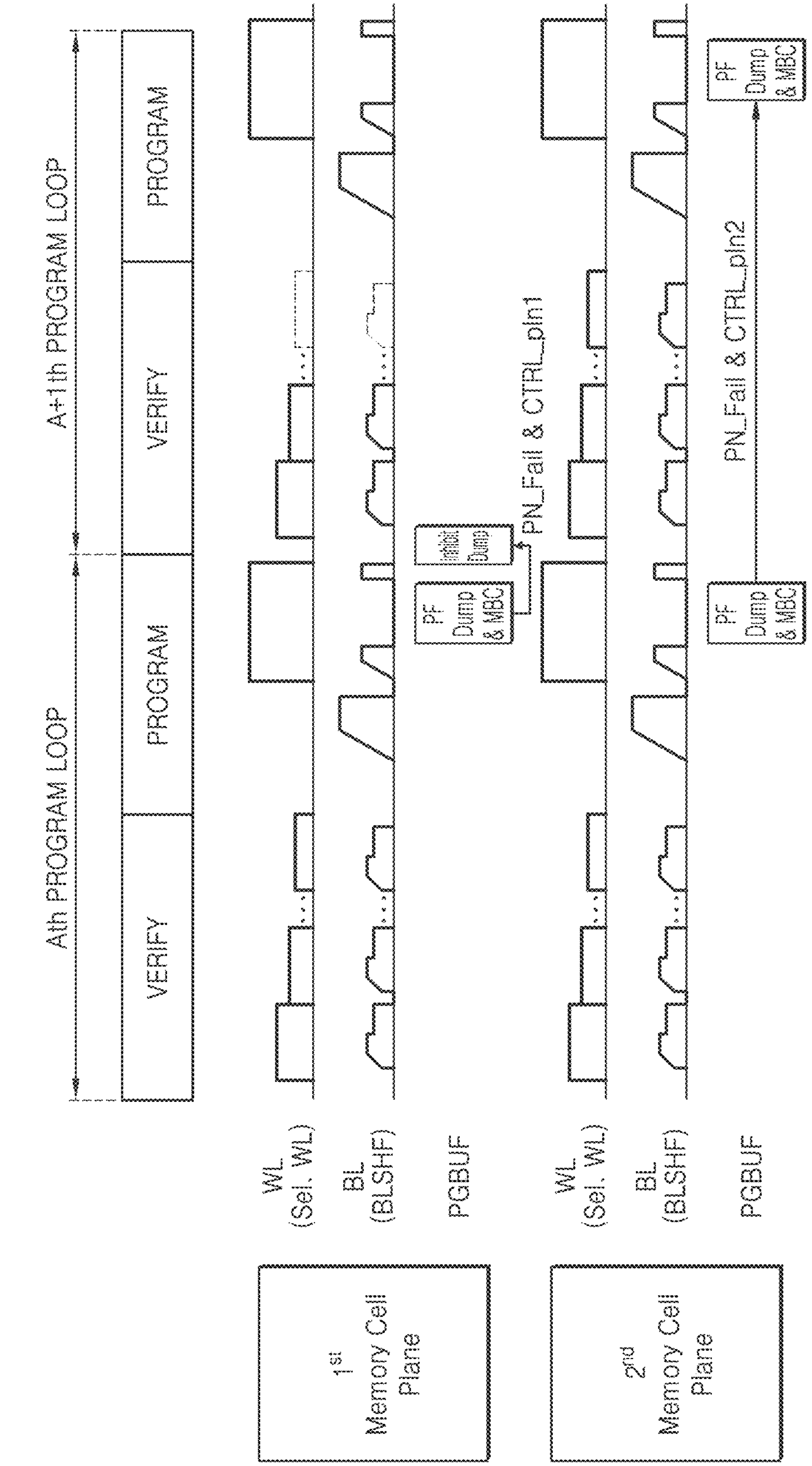
FIG. 9D is a timing diagram illustrating an example of an operation of first and second memory cell planes according to some implementations.
Figure 10:
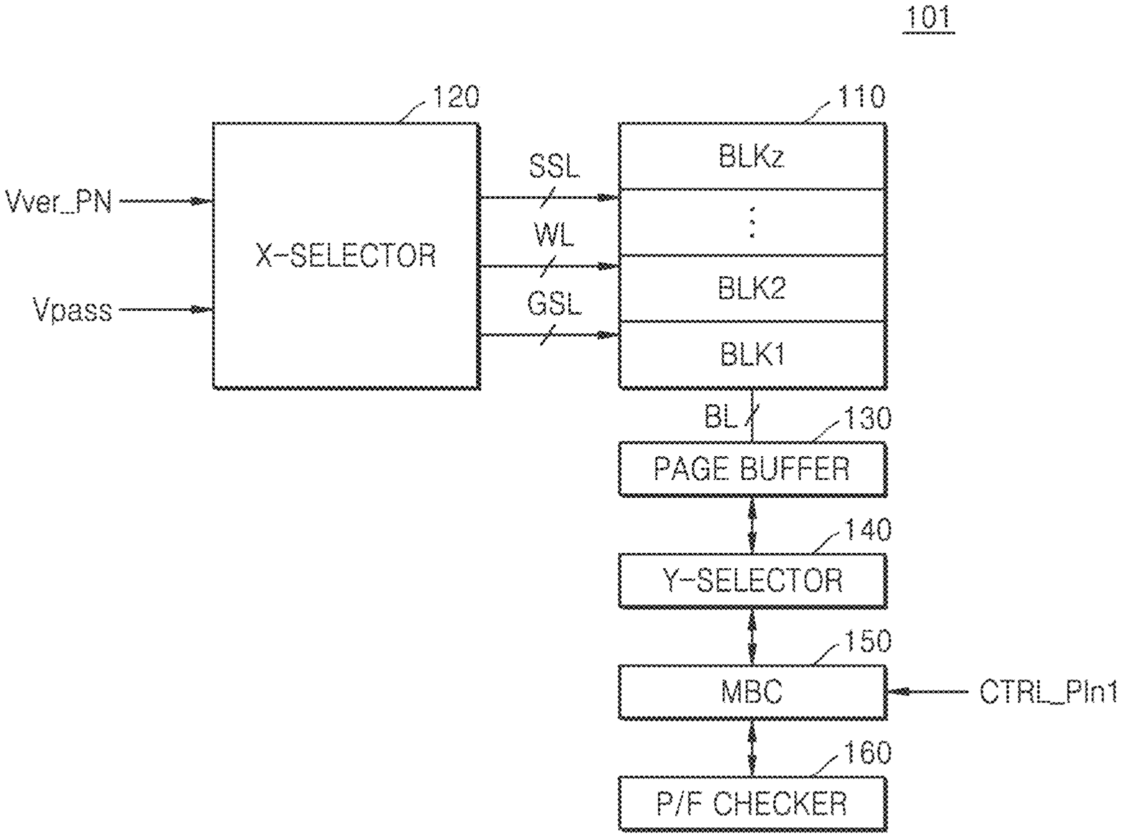
FIG. 10 is a diagram illustrating an example of an operation of a memory cell plane according to some implementations.

In FIGS. 8 to 10, various implementations thereof are described below.

Figure 8A:
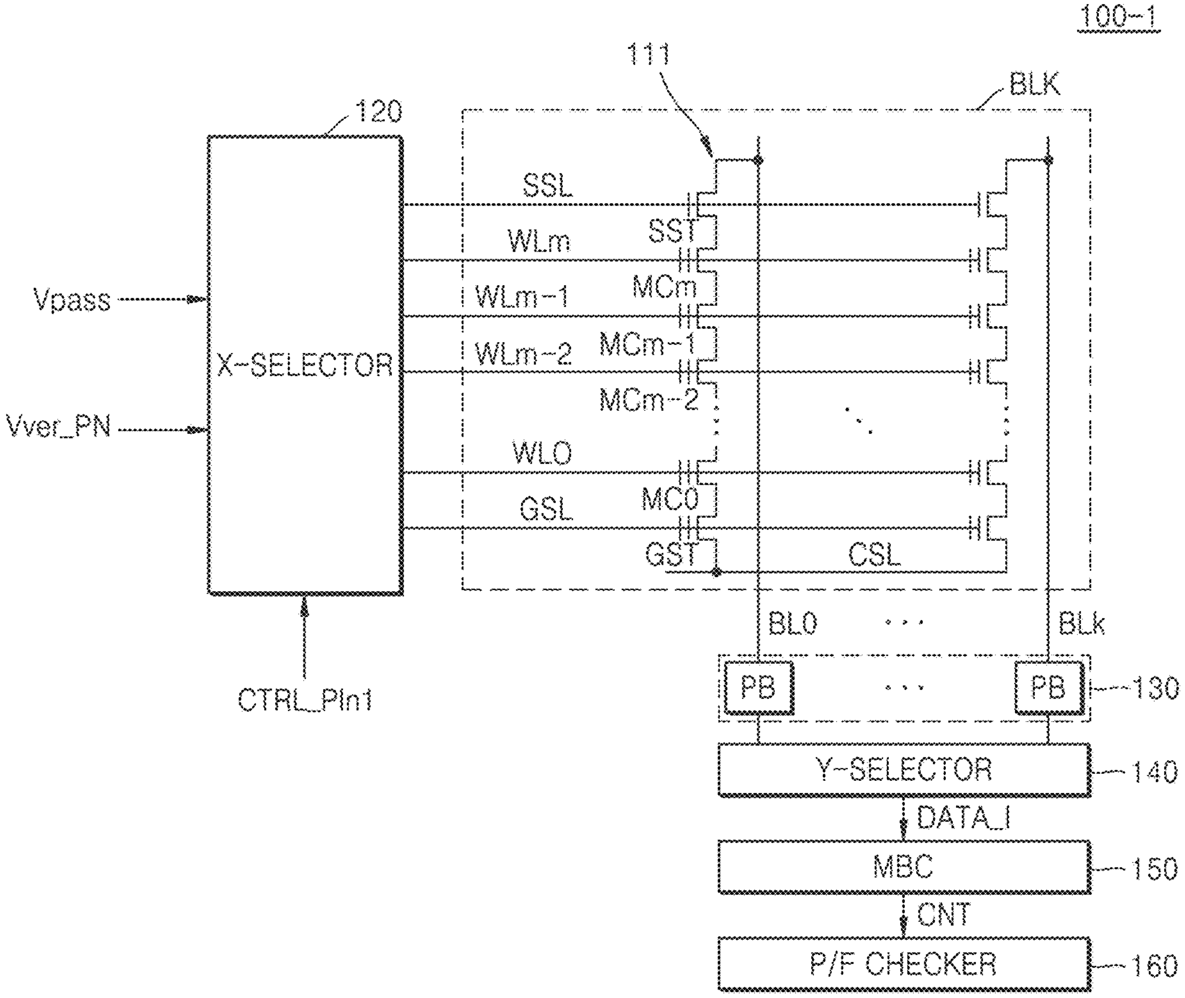
FIG. 8A is a diagram illustrating an example of an operation of a memory cell plane according to some implementations.
Figure 8B:
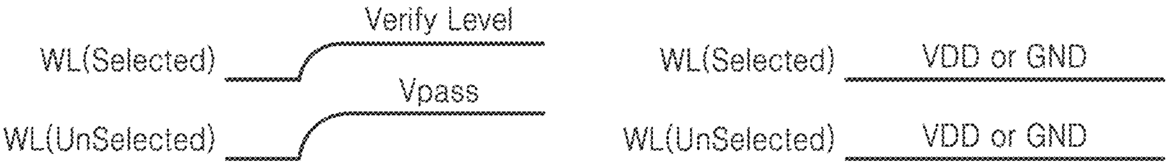
FIG. 8B is a timing diagram of an example of a verify operation of the memory cell plane including memory blocks and circuits shown in FIG. 8A according to some implementations.

FIG. 8A is a diagram illustrating an example of an operation of a memory cell plane according to some implementations. FIG. 8B is an example of a timing diagram of the verify operation of the memory cell plane including memory blocks and circuits shown in FIG. 8A according to some implementations. FIGS. 8A and 8B may be described with reference to FIGS. 1 to 5C and FIG. 7.

FIG. 8A is a diagram of an arbitrary memory block BLK of the first memory cell plane 100-1. The second memory cell plane 100-2 may have the same configuration as that of the first memory cell plane 100-1. The first memory cell plane 100-1 may operate in response to the control signal CTRL_Pln1 of the control logic 200 and the second memory cell plane 100-2 may operate in response to the control signal CTRL_Pln2 of the controller logic 200.

In FIG. 8A, the memory block BLK may include a plurality of strings. Each string 111 may include a string select transistor SST, a ground select transistor GST, and a plurality of memory cells MC0 to MCm (or memory cell transistors) connected in series between the select transistors SST and GST. The string 111 may be electrically connected to a corresponding one of bit lines BL0 to BLk. The bit lines BL0 to BLk may be shared by the memory blocks BLK1 to BLKz of the first memory cell plane 100-1. In each string 111, the string select transistor SST may be connected to a string select line SSL, the ground select transistor GST may be connected with a ground select line GSL, and the memory cell transistors MCm to MC0 may be connected to corresponding word lines WLm to WL0, respectively.

The string select line SSL, the word lines WLm to WL0, and the ground select line GSL may each be connected to the X-selector 120. The X-selector 120 may apply corresponding voltages to the select lines in response to the row address X-ADDR and the control signal CTRL_Pln1. The X-selector 120 may operate as a word line driving circuit. The X-selector 120 may block the verify voltage and the pass voltage, each applied from the voltage generator 300 in response to the control signal CTRL_Pln1. In this case, the X-selector 120 may generate a ground voltage GND or a preset voltage VDD and apply the generated ground voltage GND or the preset voltage VDD to the word lines WLm to WL0.

The page buffer circuit 130 may include page buffers PB connected to the bit lines BL0 to BLk, respectively, wherein each of the page buffers PB may output data values read during a verify operation to the MBC 150 through the Y-selector 140. The data values may be used to determine whether the program operation of the memory block has been normally performed.

In the first memory cell plane 100-1, when the verify operation based on the $N^{th}$ verify voltage Vver_PN is performed in the $A+1^{th}$ program loop described above, the X-selector 120 included in the first memory cell plane 100-1 may block the $N^{th}$ verify voltage Vver_PN for the $N^{th}$ program state and the pass voltage Vpass, each applied from the voltage generator 300, in response to the control signal CTRL_Pln1 of the control logic 200. The X-selector 120 may generate the ground voltage GND or the preset voltage VDD in response to the control signal CTRL_Pln1 of the control logic 200. As illustrated in FIG. 8A, the generated ground voltage GND or the preset voltage VDD may be applied to the word lines WLm to WL0.

The preset voltage VDD which is less than the power supply voltage Vcc may be determined in advance so as not to stress the memory cells of the programmed memory cell array 110. The preset voltage VDD may be regarded as a low level based on the power supply voltage Vcc.

Referring to (b) of FIG. 8B, the generated ground voltage GND or the preset voltage VDD may be applied to selected word lines and unselected word lines. Accordingly, the first memory cell plane 100-1 may not perform a verify operation based on the $N^{th}$ verify voltage Vver_PN in the $A+1^{th}$ program loop.

In the case of the second memory cell plane 100-2, when a verify operation based on the $N^{th}$ verify voltage Vver_PN is performed in the $A+1^{th}$ program loop described above, the X-selector 120 included in the second memory cell plane 100-2 may apply the $N^{th}$ verify voltage Vver_PN for the $N^{th}$ program state and the pass voltage Vpass, each applied from the voltage generator 300 to the word lines WLm to WL0, in response to the control signal CTRL_Pln2 of the control logic 200.

Referring to (a) of FIG. 8B, the $N^{th}$ verify voltage Vver_PN may be applied to the selected word lines and the pass voltage Vpass may be applied to the unselected word lines. Accordingly, the second memory cell plane 100-2 may perform a verify operation based on the $N^{th}$ verify voltage Vver_PN in the $A+1^{th}$ program loop.

In some implementations, while the second memory cell plane 100-2 performs a verify operation for the first program state in the second program loop described in FIG. 5C, the X-selector 120 included in the first memory cell plane 100-1 may block the verify voltage for the first program state of the memory cell plane 100-1, in response to the control signal CTRL_Pln1 of the control logic 200.

FIG. 9A is a diagram illustrating an example of an operation of a memory cell plane according to some implementations. FIG. 9B is a block diagram of an example of a structure of a page buffer according to some implementations. FIGS. 9A and 9B may be described with reference to FIGS. 1 to 5C, 7 and 8A.

While the second memory cell plane 100-2 performs a verify operation for the first program state in the second program loop described in FIG. 5C, the Y-selector 140 included in the first memory cell plane 100-1 may turn off a page buffer connected to the memory cell subject to the verify operation for the first program state in the first program loop, in response to the control signal CTRL_Pln1 of the control logic 200. That is, the Y-selector 140 included in the first memory cell plane 100-1 may turn off the page buffer connected to the program-passed memory cell for the first program state in the first program loop.

For example, by blocking a bit line voltage control signal BLSHF applied to a page buffer transistor PBTr included in the page buffer, the Y-selector 140 included in the first memory cell plane 100-1 may turn off the page buffer connected to the memory cell subject to the verify operation for the first program state in the first program loop.

In some implementations, while the second memory cell plane 100-2 performs a verify operation for the first program state in the second program loop described in FIG. 5C, the Y-selector 140 included in the first memory cell plane 100-1 may block the bit line voltage control signal BLSHF applied to the page buffer transistor PBTr included in the page buffer connected to the memory cell subject to the verify operation for the first program state in the first program loop, in response to the control signal CTRL_Pln1 of the control logic 200.

FIG. 9B is a detailed diagram of an example of a page buffer PB according to some implementations. The page buffer circuit 130 includes a plurality of page buffers PB connected to the bit lines BL0 to BLk, respectively. One of the plurality of page buffers PB is illustrated in FIG. 9B.

During a read operation or a verify operation included in a program loop, data stored in a memory cell or a threshold voltage of the memory cell may be sensed. The page buffer PB may include a sense latch 131 for storing the sensing result. In addition, the sense latch 131 may be used to apply a program bit line voltage or a program inhibit voltage to a bit line during a program operation.

The page buffer PB may include a data latch 133 and a cache latch 135 for storing program data input from the outside during a program operation. The cache latch 135 may temporarily store input data provided from the outside. During a program operation, target data stored in the cache latch 135 may be stored in the data latch 133. For example, when 3-bit data is programmed to one memory cell, the page buffer PB may store 3-bit program data input from the outside using the data latch 133 and the cache latch 135. Until programming to the memory cell is completed, the data latch 133 and the cache latch 135 may retain the stored program data. In addition, the cache latch 135 may receive data read from the memory cell from the sense latch 131 during a read operation and may output the data to the outside of the page buffer PB through a data output line.

Additionally, in some implementations, the data latch 133 may include the cache latch 135. In addition, in some implementations, the data latch 133 may include an upper bit latch M-Latch or a lower bit latch L-Latch.

In addition, the sense latch 131, the data latch 133, and the cache latch 135 may each be connected to a sensing node SO.

In addition, the page buffer PB may include the page buffer transistor PBTr that controls the connection between the bit line BL and the sense latch 131, the data latch 133, and the cache latch 135.

The page buffer transistor PBTr may be connected in series between the bit line BL and the sensing node SO. The page buffer transistor PBTr may be turned on, in response to the bit line voltage control signal BLSHF. The page buffer PB may electrically connect the sensing node SO to the bit line BL or separate the sensing node SO from the bit line BL, in response to the bit line voltage control signal BLSHF.

In some implementations, the page buffer transistor PBTr may be controlled by the bit line voltage control signal BLSHF. For example, when data is read from a memory cell, the page buffer transistor PBTr may be turned on to electrically connect the bit line BL to the sense latch 131. In addition, when data stored in the sense latch 131 is transmitted to the cache latch 135, the page buffer transistor PBTr may be turned off.

Additionally, the page buffer PB verifies whether programming of a selected memory cell from among memory cells included in a string connected to the bit line BL is completed during a program operation. Specifically, the page buffer PB may store data sensed through the bit line BL in the sense latch 131 during a program verify operation.

For example, in some of the program sections, during programming, a dumping operation may be performed to mark data stored in the sense latch 131 connected to the program-failed (or passed) memory cells as a result of program verification as logic low among memory cells to be programmed to the target program state. The dumping operation of the sense latch 131 may be referred to as a PF dump operation. However, according to an embodiment, the dumping operation of marking data stored in the sense latch 131 as logic high may also be performed.

In addition, the memory cells to be programmed to the target program state may be determined based on the data value stored in the data latch 133.

For example, the PF dump operation may be an operation of storing the sensing result (pass or fail) of the previous verify operation for memory cells to be programmed to the target program state in a plurality of sense latches 131.

The MBC 150 may count the number of sense latches 131 marked as logic low (or logic high) by the PF dump operation.

The data latch 133 storing target data may be set according to the sensed data stored in the sense latch 131. For example, when the sensed data indicates that programming is completed, the data latch 133 may be switched to a program inhibit setting for a selected memory cell in a subsequent program loop. The dumping operation of the data latch 133 may be referred to as an inhibit dump operation.

The inhibit dump operation may be an operation of changing data values stored in the data latch 133 so that the page buffer PB applies the program inhibit voltage to the bit line BL.

In some implementations, data transmitted through a data line may be loaded into the cache latch 135. In response to the control signal CTRL_Pln1 of the control logic 200, the data loaded in the cache latch 135 may be dumped into the data latch 133. In response to the control signal CTRL_Pln1 of the control logic 200, the sense latch 131 may be set according to the data loaded into the data latch 133 or into the data latch 133 and the cache latch 135. According to the value set in the sense latch 131, the bit line BL may be set up.

In some implementations, the sense latch 131 may be set according to the voltage of the bit line BL. In response to the control signal CTRL_Pln1 of the control logic 200, the data latch 133 and the cache latch 135 may be set according to the value set in the sense latch SL. In response to the control signal CTRL_Pln1 of the control logic 200, the data set in the data latch 133 or in the data latch 133 and the cache latch 135 may be output to the data line or the MBC 150.

For example, the number of data latches 133 or the number of data latches 133 and cache latches 135 may be determined according to the number of bits programmed into each memory cell of each memory block, that is, the number of logical pages belonging to one physical page.

FIG. 9C is a timing diagram illustrating an example of an operation of first and second memory cell planes according to some implementations. FIG. 9D is a timing diagram illustrating an example of an operation of first and second memory cell planes according to some implementations. In FIGS. 9C and 9D, one program loop is set in the order in which a program section PROGRAM for programming memory cells using a program voltage is followed by a verify section VERIFY for verifying memory cells using a verify voltage. For convenience of explanation, the verify operation of the page buffer PB is set to be included in one program loop from the point of view of the page buffer PB, but the present disclosure is not limited thereto. FIGS. 9C and 9D may be described with reference to FIGS. 1 to 5C, 7, 8A, and 9B.

Hereinafter, the program section PROGRAM for programming memory cells using a program voltage is referred to as a program section PROGRAM and the verify section VERIFY for verifying memory cells using a verify voltage is referred to as a verify section VERIFY.

In the program section PROGRAM, the page buffer PB may perform a PF dump operation of storing, in the sense latch 131, a sensing result using the verify voltage performed in the previous verify section VERIFY.

In FIG. 9C, the first memory cell plane 100-1 may apply the $N^{th}$ to $N+k-1^{th}$ verify voltages Vver_PN to Vver_PN+k−1 to the selected word line in the verify section of the $A^{th}$ program loop. In the program section PROGRAM in the $A^{th}$ program loop, the page buffer PB included in the first memory cell plane 100-1 may perform a PF dump operation on the sense latch 131 connected to the memory cell of which the target program state is the $N^{th}$ program state.

Then, the MBC 150 included in the first memory cell plane 100-1 may count the number of sense latches 131 marked as logic low by the PF dump operation. In some implementations, the MBC 150 may count the number of other latches marked as logic low (or logic high) other than the sense latch 131. The pass/fail checker 160 may receive a count result for the program fail (or pass) of the $N^{th}$ program state from the MBC 150, generate a pass signal PN_Pass for the $N^{th}$ program state based on the count result, and provide the generated pass signal PN_Pass for the $N^{th}$ program state to the control logic 200.

In response to the pass signal PN_Pass for the $N^{th}$ program state of the first memory cell plane 100-1, the control logic 200 may provide the control signal CTRL_Pln1 to the first memory cell plane 100-1. The control signal CTRL_Pln1 may include a signal for controlling the first memory cell plane 100-1 not to perform a PF dump operation on the sense latch 131 connected to the memory cell of which the target program state is the $N^{th}$ program state in the program section PROGRAM in the $A+1^{th}$ program loop.

For example, in response to the control signal CTRL_Pln1, the first memory cell plane 100-1 may not perform a PF operation on the sense latch 131 connected to the program-passed memory cell for the $N^{th}$ program state. Since the PF operation is not performed on the sense latch 131 connected to the memory cell in the $N^{th}$ program state in the program section PROGRAM of the $A+1^{th}$ program loop, the value stored in the sense latch 131 connected to the memory cell in the $N^{th}$ program state in the program section PROGRAM of the $A+1^{th}$ program loop may be maintained.

In some implementations, in response to the control signal CTRL_Pln1, while the second memory cell plane 100-2 performs the verify operation for the first program state in the second program loop described in FIG. 5C, the value stored in the sense latch which is included in the first memory cell plane 100-1 and connected to the program-passed memory cell for the first program state in the first program loop may be maintained.

In FIG. 9C, the second memory cell plane 100-2 may apply the $N^{th}$ to $N+k-1^{th}$ verify voltages Vver_PN to Vver_PN+k−1 to the selected word line in the verify section VERIFY of the $A^{th}$ program loop. In the program section PROGRAM of the $A^{th}$ program loop, the page buffer PB included in the second memory cell plane 100-2 may perform a PF dump operation on the sense latch 131 connected to the memory cell of which the target program state is the $N^{th}$ program state. Then, the MBC 150 included in the second memory cell plane 100-2 may count the number of sense latches 131 marked as logic low by the PF dump operation. The pass/fail checker 160 may receive a count result for the program fail (or pass) of the $N^{th}$ program state from the MBC 150, generate the fail signal PN_Fail for the $N^{th}$ program state based on the count result, and provide the generated fail signal PN_Fail for the $N^{th}$ program state to the control logic 200. In response to the fail signal PN_Fail for the $N^{th}$ program state of the second memory cell plane 100-2, the control logic 200 may provide the control signal CTRL_Pln2 to the second memory cell plane 100-2. The control signal CTRL_Pln2 may include a signal for controlling the second memory cell plane 100-2 to perform a PF dump operation on the sense latch 131 connected to the memory cell of which the target program state is the $N^{th}$ program state in the program section PROGRAM of the $A+1^{th}$ program loop.

In FIG. 9D, the first memory cell plane 100-1 may apply the $N^{th}$ to $N+k-1^{th}$ verify voltages Vver_PN to Vver_PN+k−1 to the selected word line in the verify section VERIFY of the $A^{th}$ program loop. In the program section PROGRAM of the $A^{th}$ program loop, the page buffer PB included in the first memory cell plane 100-1 may perform a PF dump operation on the sense latch 131 connected to the memory cell of which the target program state is the $N^{th}$ program state. Then, the MBC 150 included in the first memory cell plane 100-1 may count the number of sense latches 131 marked as logic low by the PF dump operation. The pass/fail checker 160 may receive a count result for the program fail (or pass) of the $N^{th}$ program state from the MBC 150, generate a pass signal PN_Pass for the $N^{th}$ program state based on the count result, and provide the generated pass signal PN_Pass for the $N^{th}$ program state to the control logic 200.

The control logic 200 may provide the control signal CTRL_Pln1 to the first memory cell plane 100-1 in response to the pass signal PN_Pass for the $N^{th}$ program state of the first memory cell plane 100-1. The control signal CTRL_Pln1 may include a signal for controlling the first memory cell plane 100-1 to perform an inhibit dump operation on the data latch 133 connected to the memory cell of which the target program state is the $N^{th}$ program state in the verify section VERIFY of the $A+1^{th}$ program loop.

For example, in response to the control signal CTRL_Pln1, the first memory cell plane 100-1 may perform an inhibit dump operation on the data latch 133 connected to the program-passed memory cell for the $N^{th}$ program state. Accordingly, then the value stored in the data latch 133 connected to the program-passed memory cell for the $N^{th}$ program state may indicate program inhibition.

In some implementations, while the second memory cell plane 100-2 performs a verify operation for the first program state in the second program loop described in FIG. 5C, a value stored in the data latch which is included in the first memory cell plane 100-1 and connected to the program-passed memory cell for the first program state in the first program loop may include indicate program inhibition.

According to some implementation, where a program-passed memory cell for a specific verify voltage (or specific program state) in any one program loop, a verify operation based on the specific verify voltage may be skipped by not performing a PF dump related to the specific verify voltage (or the specific program state) in the corresponding memory cell plane in the subsequent program loop or performing an inhibit dump related to the specific verify voltage (or specific program state). Accordingly, power required for a data write operation may be saved until program-failed memory cells for the specific verify voltage (or specific program state) becomes program-passed memory cells for the specific verify voltage (or specific program state).

FIG. 10 is a diagram illustrating an example of an operation of a memory cell plane according to some implementations. FIG. 10 may be described with reference to FIGS. 1 to 5C and FIG. 7.

In FIG. 10, although the first memory cell plane 100-1 receives the $N^{th}$ verify voltage Vver_PN from the voltage generator 300 in the $A+1^{th}$ program loop, the first memory cell plane 100-1 may not perform a verify operation based on the $N^{th}$ verify voltage Vver_PN by turning off the MBC 150 in response to the control signal CTRL_Pln1 of the control logic 200.

During a verify operation through the Y-selector 140, the MBC 150 may receive data sensed by the page buffer circuit 130 and may generate a count result from the data. For example, the MBC 150 may include an analog-to-digital converter that converts analog-level data into a count result that is a digital value. Specifically, the MBC 150 may receive a reference current from a current generator and may generate a count result based on the received reference current.

For example, the MBC 150 may count the number of sense latches 131 marked as logic low by the PF dump operation. The pass/fail checker 160 may receive a count result for the program fail (or pass) of the $N^{th}$ program state from the MBC 150, generate a pass signal PN_Pass or a fail signal PN_Fail for the $N^{th}$ program state based on the count result, and provide the generated pass signal PN_Pass or fail signal PN_Fail for the $N^{th}$ program state to the control logic 200.

In some implementations, in response to the control signal CTRL_Pln1, while the second memory cell plane 100-2 performs a verify operation for the first program state in the second program loop described in FIG. 5C, the MBC 150 included in the first memory cell plane 100-1 may not count the program-passed memory cell for the first program state in the first program loop.

According to some implementations, where a program-passed memory cell plane for a specific verify voltage (or specific program state) in any one program loop, a verify operation based on the specific verify voltage may be skipped by not performing the operation of the MBC 150 related to the specific verify voltage (or specific program state) in the corresponding memory cell plane in the subsequent program loop. Accordingly, power required for a data write operation may be saved until program-failed memory cells for the specific verify voltage (or specific program state) becomes program-passed memory cells for the specific verify voltage (or specific program state).

Figure 11:
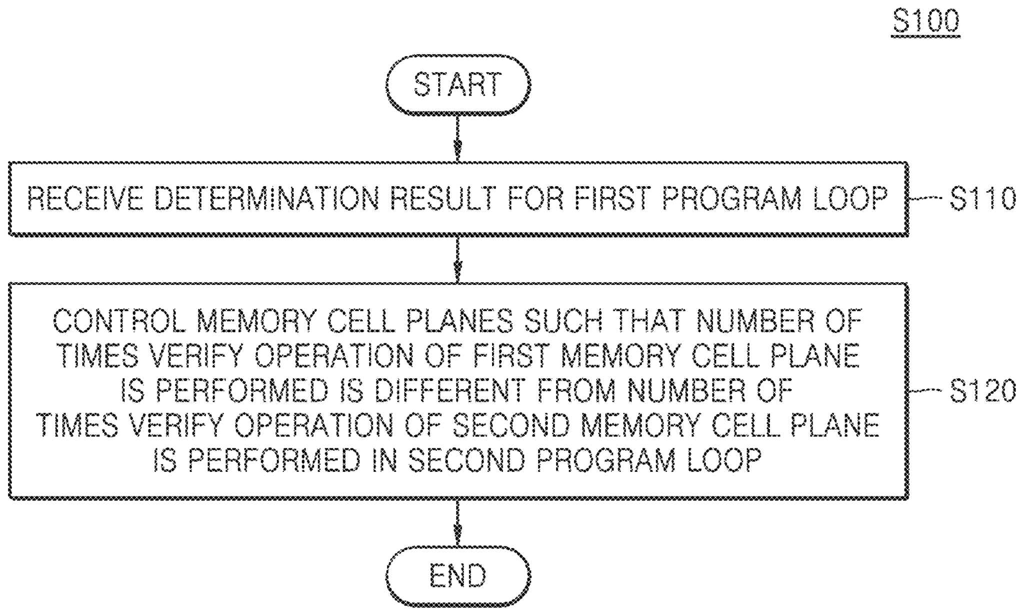
FIG. 11 is a flowchart illustrating an example of an operation of a memory device according to some implementations.

FIG. 11 is a flowchart illustrating an example of an operation of a memory device according to some implementations. FIG. 11 may be described with reference to FIGS. 1 to 10, and redundant description may be omitted.

The memory device 20 may include a voltage generator 300, control logic 200, and a plurality of memory cell planes PLNs. The voltage generator 300 may generate voltages used in a plurality of program loops for memory cells. Each of the plurality of program loops may include a program operation and at least one verify operation. In addition, the verify operation may use one of a plurality of verify voltages for verifying a plurality of program states. Each of the plurality of memory cell planes PLNs may include a plurality of memory cells, perform the plurality of program loops in response to voltages generated by the voltage generator 300, and output a determination result corresponding to the at least one verify operation for each program loop. The control logic 200 may control the memory cell planes based on the determination result.

In FIG. 11, in operation S110, the control logic 200 may receive a determination result of a first program loop in which the first memory cell plane 100-1 is determined to be program-passed and the second memory cell plane 100-2 is determined to be program-failed through a first verify voltage for the first program state.

In FIG. 11, in operation S120, the control logic 200 may control the memory cell planes such that the number of times the verify operation of the first memory cell plane 100-1 is performed is different from the number of times the verify operation of the second memory cell plane 100-2 is performed in a second program loop sequentially performed after the first program loop.

In some implementations, the control logic 200 may control the memory cell planes such that the first memory cell plane 100-1 outputs a determination result based on a second verify voltage for the second program state and the second memory cell plane 100-2 outputs a determination result based on the first verify voltage and a determination result based on the second verify voltage. For example, in the second program loop, the first memory cell plane 100-1 may omit a verify operation based on the first verify voltage for the first program state.

In some implementations, the first memory cell plane 100-1 may include a plurality of word lines connected to the plurality of memory cells and an X-selector 120 for selecting a word line. While the second memory cell plane 100-2 performs a verify operation for the first program state in the second program loop, the X-selector 120 included in the first memory cell plane 100-1 may block the verify voltage for the first program state of the first memory cell plane 100-1.

In some implementations, the first memory cell plane 100-1 may include a plurality of bit lines connected to the plurality of memory cells, a page buffer connected to each of the plurality the bit lines, and a Y-selector 140 for selecting a bit line. While the second memory cell plane 100-2 performs a verify operation for the first program state in the second program loop, the Y-selector 140 included in the first memory cell plane 100-1 may turn off the page buffer connected to the program-passed memory cell for the first program state in the first program loop.

In some implementations, the page buffer included in the first memory cell plane 100-1 may include a page buffer transistor. The Y-selector 140 included in the first memory cell plane 100-1 may turn off the page buffer by blocking a bit line voltage control signal applied to the page buffer transistor.

In some implementations, the page buffer may include a sense latch. While the second memory cell plane 100-2 performs a verify operation for the first program state in the second program loop, a value stored in the sense latch that is included in the first memory cell plane 100-1 and connected to the program-passed memory cell for the first program state in the first program loop may be maintained. For example, the first memory cell plane 100-1 may not perform a PF dump operation on the program-passed memory cell for the first program state in the second program loop.

In some implementations, the page buffer may include a data latch. While the second memory cell plane 100-2 performs a verify operation for the first program state in the second program loop, a value stored in the data latch which is included in the first memory cell plane 100-1 and connected to the program-passed memory cell for the first program state in the first program loop may indicate program inhibition. For example, the first memory cell plane 100-1 may perform an inhibit dump operation on the program-passed memory cell for the first program state in the second program loop.

In some implementations, the first memory cell plane 100-1 may include the MBC 150. While the second memory cell plane 100-2 performs a verify operation for the first program state in the second program loop, the MBC 150 may not count the program-passed memory cell for the first program state in the first program loop.

Figure 12:
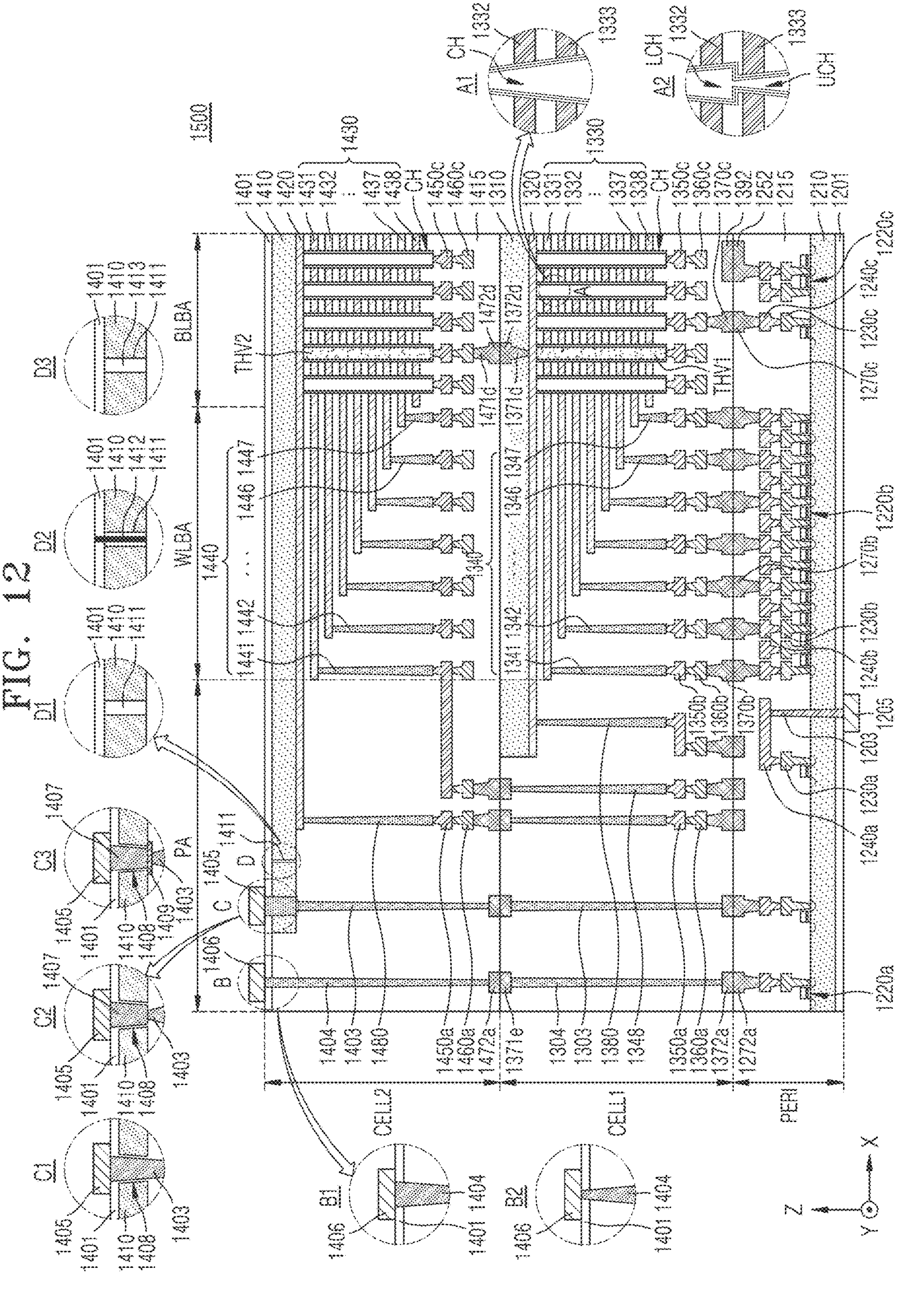
FIG. 12 is a cross-sectional view of an example of a memory device with a BVNAND structure according to some implementations.

FIG. 12 is a cross-sectional view of an example of a memory device with a BVNAND structure according to some implementations. In FIG. 12, a memory device 1500 may have a chip to chip (C2C) structure. The C2C structure may refer to a structure formed by individually manufacturing at least one upper chip including a cell area and a lower chip including a peripheral circuit area and then connecting the at least one upper chip to the lower chip by using a bonding method. As an example, the bonding method may refer to a method of electrically or physically connecting a bonding metal pattern formed on a top metal layer of the upper chip to a bonding metal pattern formed on a top metal layer of the lower chip. For example, when the bonding metal patterns are formed of copper (Cu), the bonding method may be a Cu—Cu bonding method. As another example, the bonding metal patterns may also be formed of aluminum (Al) or tungsten (W).

The memory device 1500 may include at least one upper chip including a cell area. For example, as shown in FIG. 12, the memory device 1500 may include two upper chips. However, the number of upper chips is not limited thereto. When the memory device 1500 includes two upper chips, the memory device 1500 may be produced by individually manufacturing a first upper chip including a first cell area CELL1, a second upper chip including a second cell area CELL2, and the lower chip including a peripheral circuit area PERI, and then connecting the first upper chip, the second upper chip, and the lower chip to each other by using a bonding method. The first upper chip may be reversed and connected to the lower chip by using a bonding method and the second upper chip also may be reversed and connected to the first upper chip by using a bonding method. In the following description, based on before the first upper chip and the second upper chip are reversed, the top and the bottom of the first and second upper chips are defined. For example, in FIG. 12, the top of the lower chip is defined with respect to the +Z-axis direction and the top of each of the first and second upper chips is defined with respect to the −Z-axis direction. However, one of the first upper chip and the second upper chip may also be reversed and connected to the other thereof by using a bonding method.

Each of the peripheral circuit area PERI and the first and second cell areas CELL1 and CELL2 of the memory device

1500 may include an external pad bonding area PA, a word line bonding area WLBA, and a bit line bonding area BLBA.

The peripheral circuit area PERI may include a first substrate 1210 and a plurality of circuit elements 1220*a*, 1220*b*, and 1220*c* formed on the first substrate 1210. An interlayer insulating layer 1215 including one or more insulating layers may be provided on the plurality of circuit elements 1220*a*, 1220*b*, and 1220*c*. A plurality of metal wires connecting the plurality of circuit elements 1220*a*, 1220*b*, and 1220*c* may be formed in the interlayer insulating layer 1215. For example, the plurality of metal wires may include first metal wires 1230*a*, 1230*b*, and 1230*c* connected to the plurality of circuit elements 1220*a*, 1220*b*, and 1220*c*, respectively, and second metal wires 1240*a*, 1240*b*, and 1240*c* formed on the first metal wires 1230*a*, 1230*b*, and 1230*c*. The plurality of metal wires may be formed of at least one of various conductive materials. For example, the first metal wires 1230*a*, 1230*b*, and 1230*c* may be formed of W having a relatively high electrical resistivity and the second metal wires 1240*a*, 1240*b*, and 1240*c* may also be formed of Cu having a relatively low electrical resistivity.

The present disclosure describes only the first metal wires 1230*a*, 1230*b*, and 1230*c* and the second metal wires 1240*a*, 1240*b*, and 1240*c*, but is not limited thereto. At least one or more additional metal wires may be further formed on the second metal wires 1240*a*, 1240*b*, and 1240*c*. In some implementations, the second metal wires 1240*a*, 1240*b*, and 1240*c* may be formed of Al. In addition, at least some of the additional metal wires formed on the second metal wires 1240*a*, 1240*b*, and 1240*c* may be made of Cu, and the like, which has a lower electrical resistivity than Al of the second metal wires 1240*a*, 1240*b*, and 1240*c*.

The interlayer insulating layer 1215 may be disposed on the first substrate 1210 and may include an insulating material, such as silicon oxide, silicon nitride, and the like.

Each of the first and second cell areas CELL1 and CELL2 may include at least one memory block. The first cell area CELL1 may include a second substrate 1310 and a common source line 1320. On the second substrate 1310, a plurality of word lines 1330 (1331 to 1338) may be stacked in a direction (Z-axis direction) perpendicular to an upper surface of the second substrates 1310. The string select lines and the ground select line may be arranged at the top and the bottom of the word lines 1330 and the plurality of word lines 1130 may be arranged between the string select lines and the ground select line. Similarly, the second cell area CELL2 may include a third substrate 1410 and a common source line 1420 and a plurality of word lines 1430 (1431 to 1438) may be stacked in a direction (Z-axis direction) perpendicular to an upper surface of the third substrate 1410. The second substrate 1310 and the third substrate 1410 may include various materials and may be, for example, substrates having a monocrystalline epitaxial layer grown on a silicon substrate, a silicon-germanium substrate, a germanium substrate, or a monocrystalline silicon substrate. A plurality of channel structures CH may be formed in each of the first and second cell areas CELL1 and CELL2.

In some implementations, as shown in A1, the channel structure CH may be provided in the bit line bonding area BLBA and may extend in a direction perpendicular to the upper surface of the second substrate 1310 to pass through the word lines 1330, the string select lines, and the ground select line. The channel structure CH may include a data storage layer, a channel layer, and a buried insulating layer. The channel layer may be electrically connected to a first metal wire 1350*c* and a second metal wire 1360*c* in the bit line bonding area BLBA. For example, the second metal wire 1360*c* may be a bit line and may be connected to the channel structure CH through the first metal wire 1350*c*. The bit line may extend in a first direction (Y-axis direction) parallel to the upper surface of the second substrate 1310.

In some implementations, as shown in A2, the channel structure CH may include a lower channel LCH and an upper channel UCH which are connected to each other. For example, the channel structure CH may be formed through a process for the lower channel LCH and a process of the upper channel UCH. The lower channel LCH may extend in a direction perpendicular to the upper surface of the second substrate 1310 to pass through the common source line 1320 and the lower word lines 1331 and 1332. The lower channel LCH may include a data storage layer, a channel layer, and a buried insulating layer and may be connected to the upper channel UCH. The upper channel UCH may pass through the upper word lines 1333 to 1338. The upper channel UCH may include a data storage layer, a channel layer, and a buried insulating layer, wherein the channel layer of the upper channel UCH may be electrically connected to the first metal wire 1350*c* and the second metal wire 1360*c*. As the length of a channel increases, it may become difficult to form a channel having a constant width due to process reasons. The memory device 1500 according to an embodiment may include a channel with improved width uniformity through the lower channel LCH and the upper channel UCH which are formed through a sequential process.

When the channel structure CH includes the lower channel LCH and the upper channel UCH as shown in A2, the word line located near the boundary between the lower channel LCH and the upper channel UCH may be a dummy word line. For example, the word line 1332 and the word line 1333 which form the boundary between the lower channel LCH and the upper channel UCH may be dummy word lines. In some implementations, data may not be stored in memory cells connected to the dummy word lines. Alternatively, the number of pages corresponding to the memory cells connected to the dummy word lines may be less than the number of pages corresponding to memory cells connected to general word lines. The voltage level applied to the dummy word lines may be different from the voltage level applied to the general word lines, thereby reducing the effect of the non-uniform channel width between the lower channel LCH and the upper channel UCH on the operation of the memory device.

Meanwhile, in A2, the number of the lower word lines 1331 and 1332 through which the lower channel LCH passes is shown to be less than the number of the upper word lines 1333 to 1338 through which the upper channel UCH passes. However, the present disclosure is not limited thereto. As another example, the number of lower word lines passing through the lower channel LCH may be equal to or greater than the number of upper word lines passing through the upper channel UCH. In addition, the structure and connection relationship of the channel structure CH in the first cell area CELL1 described above may be applied to the channel structure CH in the second cell area CELL2 in the same manner.

In the bit line bonding area BLBA, a first through electrode THV1 may be provided in the first cell area CELL1 and a second through electrode THV2 may be provided in the second cell area CELL2. As shown in FIG. 12, the first through electrode THV1 may pass through the common source line 1320 and the plurality of word lines 1330. However, the first through electrode THV1 may further pass through the second substrate 1310. The first through electrode THV1 may include a conductive material. Alternatively, the first through electrode THV1 may include a conductive material surrounded by an insulating material. The second through electrode THV2 may also be provided in the same shape and structure as the first through electrode THV1.

In some implementations, the first through electrode THV1 may be electrically connected to the second through electrode THV2 through a first through metal pattern 1372*d* and a second through metal pattern 1472*d*. The first through metal pattern 1372*d* may be formed at a lower end of the first upper chip including the first cell area CELL1 and the second through metal pattern 1472*d* may be formed at an upper end of the second upper chip including the second cell area CELL2. The first through electrode THV1 may be electrically connected to the first metal wire 1350*c* and the second metal wire 1360*c*. A lower via 1371*d* may be formed between the first through electrode THV1 and the first through metal pattern 1372*d* and an upper via 1471*d* may be formed between the second through electrode THV2 and the second through metal pattern 1472*d*. The first through metal pattern 1372*d* may be connected to the second through metal pattern 1472*d* by using a bonding method.

In addition, in the bit line bonding area BLBA, an upper metal pattern 1252 may be formed on the top metal layer of the peripheral circuit area PERI and an upper metal pattern 1392 of the same shape as the upper metal pattern 1252 may be formed on the top metal layer of the first cell area CELL1. The upper metal pattern 1392 of the first cell area CELL1 may be electrically connected to the upper metal pattern 1252 of the peripheral circuit area PERI by using a bonding method. In the bit line bonding area BLBA, the bit line may be electrically connected to a page buffer included in the peripheral circuit area PERI. For example, some of the circuit elements 1220*c* of the peripheral circuit area PERI may provide the page buffer and the bit line may be electrically connected to the circuit elements 1220*c* that provide the page buffer through an upper bonding metal 1370*c* of the first cell area CELL1 and an upper bonding metal 1270*c* of the peripheral circuit area PERI.

Subsequently, referring to FIG. 12, in the word line bonding area WLBA, the word lines 1330 of the first cell area CELL1 may extend in a second direction (X-axis direction) parallel to the upper surface of the second substrate 1310 and may be connected to a plurality of cell contact plugs 1340 (1341 to 1347). A first metal wire 1350*b* and a second metal wire 1360*b* may be sequentially connected to the top of each of the cell contact plugs 1340 connected to the word lines 1330. In the word line bonding area WLBA, the cell contact plugs 1340 may be connected to the peripheral circuit area PERI through an upper bonding metal 1370*b* of the first cell area CELL1 and an upper bonding metal 1270*b* of the peripheral circuit area PERI.

The cell contact plugs 1340 may be electrically connected to a row decoder included in the peripheral circuit area PERI. For example, some of the circuit elements 1220*b* of the peripheral circuit area PERI may provide the row decoder and the cell contact plugs 1340 may be electrically connected to the circuit elements 1220*b* providing the row decoder through the upper bonding metal 1370*b* of the first cell area CELL1 and the upper bonding metal 1270*b* of the peripheral circuit area PERI. In some implementations, the operating voltage of the circuit elements 1220*b* providing the row decoder may be different from the operating voltage of the circuit elements 1220*c* providing the page buffer. For example, the operating voltage of the circuit elements 1220*c* providing the page buffer may be greater than the operating voltage of the circuit elements 1220*b* providing the row decoder.

Similarly, in the word line bonding area WLBA, the word lines 1430 of the second cell area CELL2 may extend in the second direction (X-axis direction) parallel to the upper surface of the third substrate 1410 and may be connected to a plurality of cell contact plugs 1440 (1441 to 1447). The cell contact plugs 1440 may be connected to the peripheral circuit area PERI through an upper metal pattern of the second cell area CELL2, a lower metal pattern and an upper metal pattern of the first cell area CELL1, and a cell contact plug 1348.

In the word line bonding area WLBA, the upper bonding metal 1370*b* may be formed in the first cell area CELL1 and the upper bonding metal 1270*b* may be formed in the peripheral circuit area PERI. The upper bonding metal 1370*b* of the first cell area CELL1 may be electrically connected to the upper bonding metal 1270*b* of the peripheral circuit area PERI by using a bonding method. The upper bonding metal 1370*b* and the upper bonding metal 1270*b* may include Al, Cu, or W.

In the external pad bonding area PA, a lower metal pattern 1371*e* may be formed at a lower portion of the first cell area CELL1 and an upper metal pattern 1472*a* may be formed at an upper portion of the second cell area CELL2. The lower metal pattern 1371*e* of the first cell area CELL1 may be connected to the upper metal pattern 1472*a* of the second cell area CELL2 by using a bonding method in the external pad bonding area PA. Similarly, an upper metal pattern 1372*a* may be formed at an upper portion of the first cell area CELL1 and an upper metal pattern 1272*a* may be formed at an upper portion of the peripheral circuit area PERI. The upper metal pattern 1372*a* of the first cell area CELL1 may be connected to the upper metal pattern 1272*a* of the peripheral circuit area PERI by using a bonding method.

Common source line contact plugs 1380 and 1480 may be arranged in the external pad bonding area PA. The common source line contact plugs 1380 and 1480 may include a conductive material, such as metal, a metal compound, or doped polysilicon. The common source line contact plug 1380 of the first cell area CELL1 may be electrically connected to the common source line 1320, while the common source line contact plug 1480 of the second cell area CELL2 may be electronically connected to the common source line 1420. A first metal wire 1350*a* and a second metal wire 1360*a* may be sequentially stacked on the top of the common source line contact plug 1380 of the first cell area CELL1. A first metal wire 1450*a* and a second metal wire 1460*a* may also be sequentially stacked on the top of the common source line contact plug 1480 of the second cell area CELL2.

Input/output pads 1205, 1405, and 1406 may be arranged in the external pad bonding area PA. In FIG. 12, a lower insulating film 1201 may cover a lower surface of the first substrate 1210 and a first input/output pad 1205 may be formed on the lower insulating film 1201. The first input/output pad 1205 may be connected to at least one of the plurality of circuit elements 1220*a* in the peripheral circuit area PERI through a first input/output contact plug 1203 and may be separated from the first substrate 1210 by the lower insulating film 1201. In addition, a side insulating film may be positioned between the first input/output contact plug 1203 and the first substrate 1210 to electrically separate the first input/output contact plug 1203 from the first substrate 1210.

An upper insulating film 1401 covering the upper surface of the third substrate 1410 may be formed on the third substrate 1410. A second input/output pad 1405 and/or a third input/output pad 1406 may be arranged on the upper insulating film 1401. The second input/output pad 1405 may be connected to at least one of the plurality of circuit elements 1220*a* in the peripheral circuit area PERI through second input/output contact plugs 1403 and 1303. The third input/output pad 1406 may be connected to at least one of the plurality of circuit elements 1220*a* in the peripheral circuit area PERI through third input/output contact plugs 1404 and 1304.

In some implementations, the third substrate 1410 may not be positioned in an area where input/output contact plugs are arranged. For example, as shown in B1 and B2, the third input/output contact plug 1404 may be separated from the third substrate 1410 in a direction parallel to the upper surface of the third substrate 1410 and may pass through the interlayer insulating layer 1415 of the second cell area CELL2 to be connected to the third input/output pad 1406. In this case, the third input/output contact plug 1404 may be formed through various processes.

For example, as shown in B1, the third input/output contact plug 1404 may extend in the third direction (Z-axis direction) and the diameter of the third input/output contact plug 1404 may increase toward the upper insulating film 1401. That is, the diameter of the channel structure CH described in A1 may decrease toward the upper insulating film 1401, while the diameter of the third input/output contact plug 1404 increases toward the upper insulating film 1401. For example, the third input/output contact plug 1404 may be formed after the second cell area CELL2 is bonded to the first cell area CELL1 by using a bonding method.

In addition, for example, as shown in B2, the third input/output contact plug 1404 may extend in the third direction (Z-axis direction) and the diameter of the third input/output contact plug 1404 may decrease toward the upper insulating film 1401. In some implementations, the diameter of the third input/output contact plug 1404 may decrease toward the upper insulating film 1401, like the channel structure CH. For example, the third input/output contact plug 1404 may be formed together with the cell contact plugs 1440 before the second cell area CELL2 is bonded to the first cell area CELL1.

In some implementations, an input/output contact plug may overlap with the third substrate 1410. For example, as shown in C1 to C3, the second input/output contact plug 1403 may pass through the interlayer insulating layer 1415 of the second cell area CELL2 in the third direction (Z-axis direction) and may be electrically connected to the second input/output pad 1405 through the third substrate 1410. For example, the connection structure between the second input/output contact plug 1403 and the second input/output pad 1405 may be implemented in various ways.

For example, as shown in C1, an opening 1408 passing through the third substrate 1410 may be formed. The second input/output contact plug 1403 may be directly connected to the second input/output pad 1405 through the opening 1408 which is formed in the third substrate 1410. In this case, as shown in C1, the diameter of the second input/output contact plug 1403 may increase toward the second input/output pad 1405. However, the diameter of the second input/output contact plug 1403 may decrease toward the second input/output pad 1405.

For example, as shown in C2, the opening 1408 passing through the third substrate 1410 may be formed and a contact 1407 may be provided in the opening 1408. One end of the contact 1407 may be connected to the second input/output pad 1405 and the other end thereof may be connected to the second input/output contact plug 1403. Accordingly, the second input/output contact plug 1403 may be electrically connected to the second input/output pad 1405 through the contact 1407 in the opening 1408. In some implementations, as shown in C2, the diameter of the contact 1407 may increase toward the second input/output pad 1405 and the diameter of the second input/output contact plug 1403 may decrease toward the second input/output pad 1405. For example, the second input/output contact plug 1403 may be formed together with the cell contact plugs 1440 before bonding the second cell area CELL2 to the first cell area CELL1 and the contact 1407 may be formed after bonding the second cell area CELL2 to the first cell area CELL1.

In addition, for example, as shown in C3, a stopper 1409 may be further formed on the upper surface of the opening 1408 of the third substrate 1410, compared to C2. The stopper 1409 may be a metal wire formed on the same layer as the common source line 1420. However, the stopper 1409 may be a metal wire formed in the same layer as at least one of the word lines 1430. The second input/output contact plug 1403 may be electrically connected to the second input/output pad 1405 through the contact 1407 and the stopper 1409.

On the other hand, similar to the second and third input/output contact plugs 1403 and 1404 of the second cell area CELL2, the diameter of each of the second and third input/output contact plugs 1303 and 1304 may decrease toward the lower metal pattern 1371*e* or may increase toward the lower metal pattern 1371*e*.

Meanwhile, according to some implementations, a slit 1411 may be formed in the third substrate 1410. For example, the slit 1411 may be formed at an arbitrary position of the external pad bonding area PA. As an example, as shown in D1 to D3, the slit 1411 may be positioned between the second input/output pad 1405 and the cell contact plugs 1440 in a plan view. In a plan view, the slit 1411 may be formed such that the second input/output pad 1405 is positioned between the slit 1411 and the cell contact plugs 1440.

For example, as shown in D1, the slit 1411 may pass through the third substrate 1410. The slit 1411 may be used, for example, to prevent the third substrate 1410 from being finely cracked when forming the opening 1408. However, the slit 1411 may be formed to a depth of about 60 to about 70% of the thickness of the third substrate 1410.

In addition, for example, as shown in D2, a conductive material 1412 may be formed in the slit 1411. The conductive material 1412 may be used, for example, to discharge a leakage current generated while driving circuit elements in the external pad bonding area PA to the outside. In some implementations, the conductive material 1412 may be connected to an external ground line.

In addition, for example, as shown in D3, an insulating material 1413 may be formed in the slit 1411. The insulating material 1413 may be formed, for example, to electrically separate the second input/output pad 1405 and the second input/output contact plug 1403 in the external pad bonding area PA from the word line bonding area WLBA. By forming the insulating material 1413 in the slit 1411, the voltage provided through the second input/output pad 1405 may be prevented from affecting the metal layer disposed on the third substrate 1410 in the word line bonding area WLBA.

Meanwhile, according to some implementations, the first to third input/output pads 1205, 1405, and 1406 may be selectively formed. For example, the memory device 1500 may be implemented to include only the first input/output pad 1205 disposed above the first substrate 1210, or only the second input/output pad 1405 disposed above the third substrate 1410, or only the third input/output pad 1406 disposed on the upper insulating film 1401.

Meanwhile, according to some implementations, at least one of the second substrate 1310 of the first cell area CELL1 and the third substrate 1410 of the second cell area CELL2 may be used as a sacrificial substrate and may be completely or partially removed before or after the bonding process. After removing a substrate, an additional film may be deposited. For example, the second substrate 1310 of the first cell area CELL1 may be removed before or after bonding the peripheral circuit area PERI to the first cell area CELL1 and an insulating film covering the upper surface of the common source line 1320 or a conductive film for connection may be formed. Similarly, the third substrate 1410 of the second cell area CELL2 may be removed before or after bonding the first cell area CELL1 to the second cell area CELL2 and an upper insulating film 1401 covering the upper surface of the common source line 1420 or a conductive film for connection may be formed.

Figure 13:
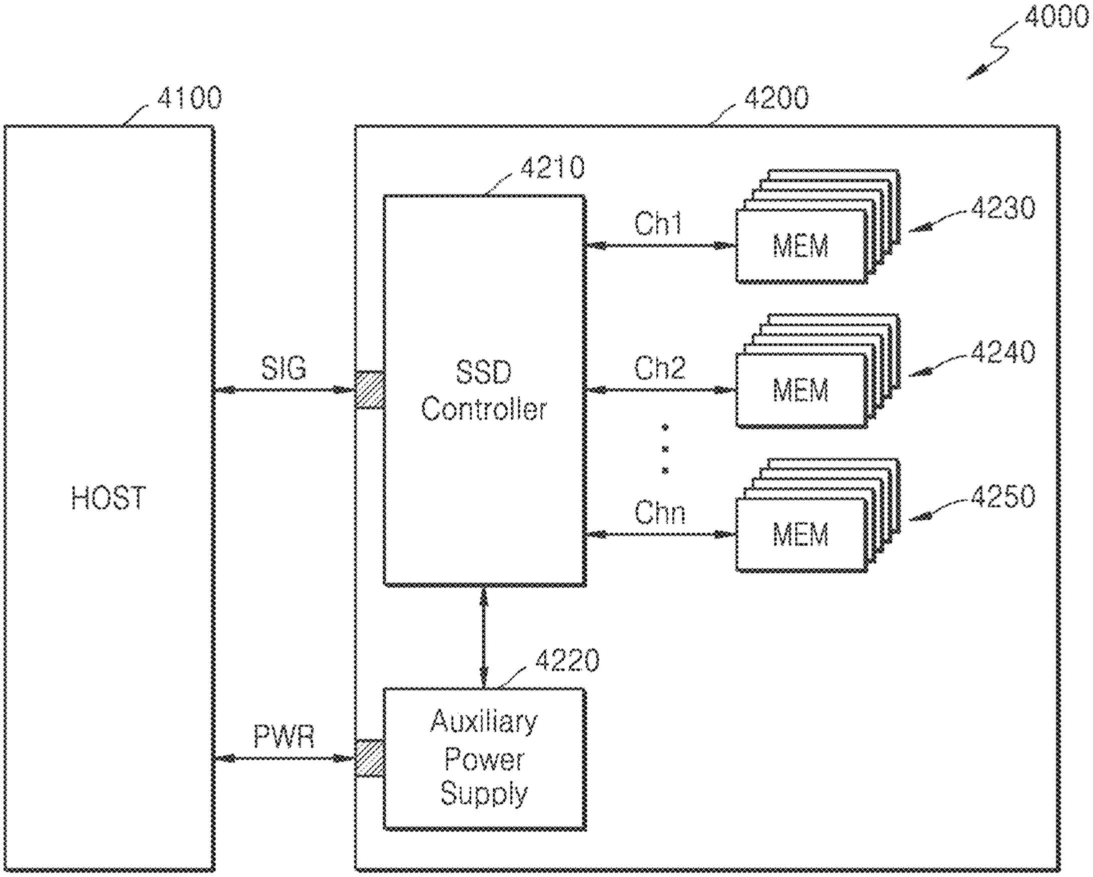
FIG. 13 is a block diagram of an example of an SSD system including a memory according to some implementations.

FIG. 13 is a block diagram of an example of an SSD system where a memory device is applied according to some implementations. In FIG. 13, an SSD system 4000 may include a host 4100 and an SSD 4200. The SSD 4200 exchanges signals with the host 4100 through a signal connector and receives power through a power connector. The SSD 4200 may include an SSD controller 4210, an auxiliary power supply 4220, and memory devices 4230, 4240, and 4250. The memory devices 4230, 4240, and 4250 may include vertically stacked NAND flash memory devices. The memory devices 4230, 4240, and 4250 may be implemented using the embodiments described above with reference to FIGS. 1 to 12.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. A memory device comprising:

a voltage generator configured to generate voltages for a plurality of program loops for memory cells, wherein each of the plurality of program loops comprises a program operation and at least one verify operation, wherein the at least one verify operation uses one of a plurality of verify voltages for verifying a plurality of program states;

a plurality of memory cell planes each comprising a plurality of memory cells, the plurality of memory cell planes each configured to perform the plurality of program loops in response to the plurality of verify voltages and output a determination result corresponding to the at least one verify operation for each of the plurality of program loops; and control logic configured to control the plurality of memory cell planes based on the determination result, wherein the control logic is further configured to, based on the determination result regarding a first program loop of the plurality of program loops in which (i) a first memory cell plane of the plurality of memory cell planes is determined to be program-passed and (ii) a second memory cell plane of the plurality of memory cell planes is determined to be program-failed through a first verify voltage of the plurality of verify voltages for a first program state of the plurality of program states, control the memory cell planes such that a number of times the verify operation of the first memory cell plane is performed is different from a number of times the verify operation of the second memory cell plane is performed in a second program loop of the plurality of program loops performed sequentially after the first program loop.

2. The memory device of claim 1, wherein the control logic is further configured to, based on the determination result regarding the first program loop, control the plurality of memory cell planes such that (i) the first memory cell plane outputs a determination result based on a second verify voltage of the plurality of verify voltages for a second program state of the plurality of program states and (ii) the second memory cell plane outputs a determination result based on the first verify voltage and a determination result based on the second verify voltage in the second program loop.

3. The memory device of claim 1, wherein the first memory cell plane comprises a plurality of word lines connected to a plurality of memory cells, and an X-selector configured to select a word line from the plurality of word lines, wherein the X-selector is further configured to block the first verify voltage for the first program state of the first memory cell plane, based on the second memory cell plane performing the verify operation for the first program state in the second program loop.

4. The memory device of claim 1, wherein the first memory cell plane comprise a plurality of bit lines connected to the plurality of memory cells, a page buffer connected to each of the plurality of bit lines, and a Y-selector configured to select a bit line from the plurality of bit lines, wherein the Y-selector is further configured to turn off the page buffer connected to a program-passed memory cell of the plurality of memory cells for the first program state in the first program loop, based on the second memory cell plane performing the verify operation for the first program state in the second program loop.

5. The memory device of claim 4, wherein the page buffer comprises a page buffer transistor, and wherein the Y-selector is further configured to turn off the page buffer by blocking a bit line voltage control signal input to the page buffer transistor.

6. The memory device of claim 1, wherein the first memory cell plane comprises a plurality of bit lines connected to the plurality of memory cells, and a page buffer connected to each of the plurality of bit lines, wherein the page buffer comprises a sense latch, and wherein a value stored in the sense latch included in the first memory cell plane and connected to a program-passed memory cell of the plurality of memory cells for the first program state in the first program loop is maintained based on the second memory cell plane performing the verify operation for the first program state in the second program loop.

7. The memory device of claim 1, wherein the first memory cell plane comprises a plurality of bit lines connected to the plurality of memory cells, and a page buffer connected to each of the plurality of bit lines, wherein the page buffer comprises a data latch, and wherein a value stored in the data latch included in the first memory cell plane and connected to a program-passed memory cell of the plurality of memory cells for the first program state in the first program loop indicates program inhibition, based on the second memory cell plane performing the verify operation for the first program state in the second program loop.

8. The memory device of claim 2, wherein the first memory cell plane comprises a mass bit counter, and wherein the mass bit counter is configured not to count a program-passed memory cell of the plurality of memory cells for the first program state in the first program loop, based on the second memory cell plane performing the verify operation for the first program state in the second program loop.

9. A memory system comprising:

a memory controller; and a memory device comprising:

a voltage generator configured to generate voltages for a plurality of program loops for memory cells, wherein each of the plurality of program loops comprises a program operation and at least one verify operation, wherein the verify operation uses one of a plurality of verify voltages for verifying a plurality of program states;

a plurality of memory cell planes each comprising a plurality of memory cells, the plurality of memory cell planes each configured to perform the plurality of program loops in response to the plurality of verify voltages and output a determination result corresponding to the at least one verify operation for each of the plurality of program loops; and control logic configured to control the plurality of memory cell planes based on the determination result, wherein the control logic is configured to based on the determination result regarding a first program loop of the plurality of program loops in which (i) a first memory cell plane of the plurality of memory cell planes is determined to be program-passed and (ii) a second memory cell plane of the plurality of memory cell planes is determined to be program-failed through a first verify voltage of the plurality of verify voltages for a first program state of the plurality of program states, control the memory cell planes such that a number of times the verify operation of the first memory cell plane is performed is different from a number of times the verify operation of the second memory cell plane is performed in a second program loop of the plurality of program loops performed sequentially after the first program loop.

10. The memory system of claim 9, wherein the control logic is further configured to, based on the determination result regarding the first program loop, control the plurality of memory cell planes such that (i) the first memory cell plane outputs a determination result based on a second verify voltage of the plurality of verify voltages for a second program state of the plurality of program states and (ii) the second memory cell plane outputs a determination result based on the first verify voltage and a determination result based on the second verify voltage in the second program loop.

11. The memory system of claim 9, wherein the first memory cell plane comprises a plurality of word lines connected to the plurality of memory cells, and an X-selector configured to select a word line from the plurality of word lines, wherein the X-selector is further configured to block the first verify voltage for the first program state of the first memory cell plane, based on the second memory cell plane performing the verify operation for the first program state in the second program loop.

12. The memory system of claim 9, wherein the first memory cell plane comprises a plurality of bit lines connected to the plurality of memory cells, a page buffer connected to each of the plurality of bit lines, and a Y-selector configured to select a bit line from the plurality of bit lines, wherein the Y-selector is further configured to turn off the page buffer connected to a program-passed memory cell of the plurality of memory cells for the first program state in the first program loop, based on the second memory cell plane performing the verify operation for the first program state in the second program loop.

13. The memory system of claim 12, wherein the page buffer comprises a page buffer transistor, and wherein the Y-selector is further configured to turn off the page buffer by blocking a bit line voltage control signal applied to the page buffer transistor.

14. The memory system of claim 9, wherein the first memory cell plane comprises a plurality of bit lines connected to the plurality of memory cells, and a page buffer connected to each of the plurality of bit lines, wherein the page buffer comprises a sense latch, and wherein a value stored in the sense latch included in the first memory cell plane and connected to a program-passed memory cell of the plurality of memory cells for the first program state in the first program loop is maintained based on the second memory cell plane performing the verify operation for the first program state in the second program loop.

15. The memory system of claim 9, wherein the first memory cell plane comprises a plurality of bit lines connected to the plurality of memory cells, and a page buffer connected to each of the plurality of bit lines, wherein the page buffer comprises a data latch, and wherein a value stored in the data latch included in the first memory cell plane and connected to a program-passed memory cell of the plurality of memory cells for the first program state in the first program loop indicates program inhibition, based on the second memory cell plane performing the verify operation for the first program state in the second program loop.

16. The memory system of claim 9, wherein the first memory cell plane comprises a mass bit counter, and wherein the mass bit counter is configured not to count a program-passed memory cell of the plurality of memory cells for the first program state in the first program loop, based on the second memory cell plane performs the verify operation for the first program state in the second program loop.

17. An operating method of a memory device, wherein the memory device comprises:

a voltage generator configured to generate voltages for a plurality of program loops for a plurality of memory cells, wherein each of the plurality of program loops comprises a program operation and at least one verify operation, wherein the at least one verify operation uses one of a plurality of verify voltages for verifying a plurality of program states;

a plurality of memory cell planes each comprising a plurality of memory cells, the plurality of memory cell planes each configured to perform the plurality of program loops in response to the plurality of verify voltages and output a determination result corresponding to the at least one verify operation for each of the plurality of program loops; and control logic configured to control the plurality of memory cell planes based on the determination result, wherein the operating method comprises:

receiving a determination result for a first program loop of the plurality of program loops in which a first memory cell plane of the plurality of memory cell planes is determined to be program-passed and a second memory cell plane of the plurality of memory cell planes is determined to be program-failed through a first verify voltage of the plurality of verify voltages for a first program state of the plurality of program states; and controlling the plurality of memory cell planes so that a number of times the verify operation of the first memory cell plane is performed is different from a number of times the verify operation of the second memory cell plane is performed in a second program loop of the plurality of program loops performed sequentially after the first program loop.

18. The operating method of claim 17, wherein the controlling of the plurality of memory cell planes comprises controlling the plurality of memory cell planes so that the first memory cell plane outputs a determination result based on a second verify voltage of the plurality of verify voltages for a second program state of the plurality of program states and the second memory cell plane outputs a determination result based on the first verify voltage and a determination result based on the second verify voltage in the second program loop.

19. The operating method of claim 17, wherein the first memory cell plane comprises a plurality of word lines connected to the plurality of memory cells, and an X-selector configured to select a word line of the plurality of word lines, wherein the operating method further comprises blocking, by the X-selector, the first verify voltage for the first program state of the first memory cell plane, based on the second memory cell plane performing the verify operation for the first program state in the second program loop.

20. The operating method of claim 17, wherein the first memory cell plane comprises a plurality of bit lines connected to the plurality of memory cells, a page buffer connected to each of the plurality of bit lines, and a Y-selector configured to select a bit line of the plurality of bit lines, wherein the operating method further comprises turning off, by the Y-selector, the page buffer connected to a program-passed memory cell of the plurality of memory cells for the first program state in the first program loop, based on the second memory cell plane performing the verify operation for the first program state in the second program loop.

* * * * *